US005702565A

United States Patent [19]

Wu et al.

[11] Patent Number: 5,702,565

[45] Date of Patent: Dec. 30, 1997

[54] PROCESS FOR LASER SCRIBING A PATTERN IN A PLANAR LAMINATE

[75] Inventors: Xingwei Wu; James Alexander Robert Stiles; Ken Kok Foo; Phillip Bailey, all of Edmonton, Canada

[73] Assignee: Westaim Technologies, Inc., Fort Saskatchewan, Canada

[21] Appl. No.: 449,507

[22] Filed: May 23, 1995

Related U.S. Application Data

[62] Division of Ser. No. 430,729, Apr. 28, 1995, which is a division of Ser. No. 52,702, Apr. 30, 1993, Pat. No. 5,432,015, which is a continuation-in-part of Ser. No. 996,547, Dec. 24, 1992, abandoned, which is a continuation-in-part of Ser. No. 880,436, May 8, 1992, abandoned.

[51] Int. Cl.$^{6}$ .............................. B24C 1/22; H01L 39/24

[52] U.S. Cl. .............................. 156/643.1; 156/625.1; 204/157; 204/22; 216/65; 216/94; 427/66; 427/508; 117/44; 117/904; 505/325; 505/410; 505/412

[58] Field of Search .............................. 204/157.22; 216/65, 216/94; 427/66, 508; 156/625.1, 643.1; 264/1.37, 400, 482, 554; 117/44, 904; 505/325, 410, 412

[56] References Cited

U.S. PATENT DOCUMENTS

| | | | |
|---|---|---|---|
| Re. 33,947 | 6/1992 | Shinohara | 156/643 |
| 2,497,912 | 12/1950 | Hoffman et al. | 315/169 |
| 3,475,640 | 10/1969 | Litant et al. | 313/108 |
| 3,504,214 | 3/1970 | Lake et al. | 313/108 |
| 3,641,390 | 2/1972 | Nakamura | 315/169 |
| 3,828,215 | 8/1974 | Bilsback | 313/50 |
| 3,889,151 | 6/1975 | Hanak et al. | 315/170 |
| 4,280,107 | 7/1981 | Scifres et al. | 331/94.5 H |
| 4,292,092 | 9/1981 | Hanak | 148/1.5 |
| 4,416,933 | 11/1983 | Antson et al. | 428/216 |
| 4,418,118 | 11/1983 | Lindors | 428/336 |

(List continued on next page.)

FOREIGN PATENT DOCUMENTS

| | | |
|---|---|---|
| A10111568 | 6/1984 | European Pat. Off. . |
| A0 145 470 | 6/1985 | European Pat. Off. . |

(List continued on next page.)

OTHER PUBLICATIONS

Tomqvist, *"Thin Film Electroluminescent Displays,"* 4 SID 4, 1989, Intn'l Symposium Seminar Lecture Notes.

Miyata, et al., *"A High-Level Light and Sound-Emitting EL Display Fabricated . . . "*, Kanazawa Institute of Techn., 1991, 70 SID 91 Digest, pp. 70–73.

(List continued on next page.)

*Primary Examiner*—Charles Nold

*Attorney, Agent, or Firm*—Greenlee, Winner & Sullivan, P.C.

[57] ABSTRACT

An improved dielectric layer of an electroluminescent laminate, and method of preparation are provided. The dielectric layer is formed as a thick layer from a ceramic material to provide:

a dielectric strength greater than about $1.0\times10^{6}$ V/m;

a dielectric constant such that the ratio of the dielectric constant of the dielectric material to that of the phosphor layer is greater than about 50:1;

a thickness such that the ratio of the thickness of the dielectric layer to that of the phosphor layer is in the range of about 20:1 to 500:1; and a surface adjacent the phosphor layer which is compatible with the phosphor layer and sufficiently smooth that the phosphor layer illuminates generally uniformly at a given excitation voltage.

The invention also provides for electrical connection of an electroluminescent laminate to voltage driving circuity with through hole technology. The invention also extends to laser scribing the transparent conductor lines of an electroluminescent laminate.

16 Claims, 9 Drawing Sheets

U.S. PATENT DOCUMENTS

| | | | |
|---|---|---|---|
| 4,468,659 | 8/1984 | Ohba et al. | 340/719 |
| 4,482,841 | 11/1984 | Tiku et al. | 313/503 |
| 4,490,603 | 12/1984 | Soltani | 427/66 |
| 4,508,990 | 4/1985 | Essinger | 313/56 |
| 4,568,409 | 2/1986 | Caplan | 427/508 |
| 4,568,578 | 2/1986 | Arfsten et al. | 427/108 |
| 4,593,228 | 6/1986 | Albrechtson et al. | 313/509 |
| 4,614,668 | 9/1986 | Topp et al. | 427/66 |
| 4,617,195 | 10/1986 | Mental | 427/66 |
| 4,665,342 | 5/1987 | Topp et al. | 313/505 |
| 4,667,058 | 5/1987 | Catalano et al. | 136/244 |
| 4,680,855 | 7/1987 | Yamazaki et al. | 29/583 |
| 4,686,110 | 8/1987 | Endo et al. | 417/38 |
| 4,686,426 | 8/1987 | Fujiuka et al. | 315/169.3 |
| 4,691,078 | 9/1987 | Nishioka et al. | 174/68.5 |
| 4,693,906 | 9/1987 | Lindmayer | 427/69 |
| 4,705,698 | 11/1987 | Van Dine | 427/531 |
| 4,710,395 | 12/1987 | Young et al. | 428/8 |
| 4,713,518 | 12/1987 | Yamazaki et al. | 219/121 LM |
| 4,721,631 | 1/1988 | Endo et al. | 427/66 |
| 4,749,840 | 6/1988 | Piwczyk | 219/121 LH |
| 4,757,235 | 7/1988 | Nunomura et al. | 313/509 |
| 4,783,421 | 11/1988 | Carlson et al. | 437/4 |
| 4,786,358 | 11/1988 | Yamazaki et al. | 156/643 |
| 4,792,500 | 12/1988 | Kojima | 428/690 |
| 4,804,558 | 2/1989 | Saitoh et al. | 427/66 |
| 4,849,252 | 7/1989 | Arfsten et al. | 313/509 |
| 4,849,674 | 7/1989 | Cherry et al. | 427/34 |
| 4,854,974 | 8/1989 | Carlson et al. | 136/244 |
| 4,857,802 | 8/1989 | Fuyama et al. | 313/506 |
| 4,861,964 | 8/1989 | Sinohara | 219/121.68 |
| 4,865,686 | 9/1989 | Sinohara et al. | 156/643 |
| 4,866,348 | 9/1989 | Harada et al. | 315/169.3 |
| 4,874,920 | 10/1989 | Yamazaki et al. | 219/121.85 |
| 4,877,481 | 10/1989 | Fukuda et al. | 313/503 |
| 4,877,994 | 10/1989 | Fuyama et al. | 313/503 |
| 4,879,139 | 11/1989 | Oootsuka et al. | 427/38 |
| 4,880,475 | 11/1989 | Lindmayer | 427/69 |
| 4,885,448 | 12/1989 | Kasner et al. | 219/121.68 |
| 4,897,319 | 1/1990 | Sun | 428/690 |
| 4,909,895 | 3/1990 | Cusano | 156/243 |
| 4,915,982 | 4/1990 | Lindmayer | 427/69 |
| 4,927,490 | 5/1990 | Mierzwinski | 156/643 |
| 4,927,493 | 5/1990 | Yamazaki et al. | 156/634 |
| 4,937,129 | 6/1990 | Yamazaki | 428/195 |
| 4,965,092 | 10/1990 | Hayduk, Jr. et al. | 427/96 |
| 4,970,366 | 11/1990 | Imatou et al. | 219/121.68 |
| 4,970,368 | 11/1990 | Yamazaki et al. | 219/121.85 |
| 4,970,369 | 11/1990 | Yamazaki et al. | 219/121.85 |
| 4,975,145 | 12/1990 | Yamazaki et al. | 156/643 |
| 4,981,712 | 1/1991 | Yamamoto et al. | 427/38 |
| 4,983,885 | 1/1991 | Fujioka et al. | 315/169.3 |
| 5,006,365 | 4/1991 | Nire et al. | 427/66 |
| 5,043,567 | 8/1991 | Sakama et al. | 250/208.1 |
| 5,057,664 | 10/1991 | Johnson et al. | 219/121.69 |
| 5,109,149 | 4/1992 | Leung | 219/121.69 |
| 5,131,877 | 7/1992 | Mathumoto | 455/24 |

FOREIGN PATENT DOCUMENTS

| | | |
|---|---|---|
| 0 160 227 A1 | 11/1985 | European Pat. Off. . |
| 0 184 877 A1 | 6/1986 | European Pat. Off. . |
| 0 278 194 A1 | 8/1988 | European Pat. Off. . |
| 0 295 477 A2 | 12/1988 | European Pat. Off. . |
| 0 365 445 A2 | 4/1990 | European Pat. Off. . |
| 35 18598 A1 | 11/1985 | Germany . |
| SHO52-58494 | 5/1977 | Japan . |
| SHO60-133792 | 6/1985 | Japan . |
| Shoh61-168895 | 1/1986 | Japan . |
| SHO63-182892 | 3/1988 | Japan . |
| HEI1-236687 | 1/1989 | Japan . |
| 1272095 | 10/1989 | Japan . |
| 2044691 | 2/1990 | Japan . |
| HEI2-33890 | 9/1990 | Japan . |
| HEI3-105894 | 4/1991 | Japan . |
| 1 141 420 | 1/1969 | United Kingdom . |
| 1 161 977 | 6/1969 | United Kingdom . |
| 1 194 304 | 6/1970 | United Kingdom . |
| 1 259 358 | 1/1972 | United Kingdom . |
| 1 431 889 | 4/1976 | United Kingdom . |
| 2 084 778 | 4/1982 | United Kingdom . |
| 2 161 011 | 1/1986 | United Kingdom . |
| 2 161 306 | 1/1986 | United Kingdom . |
| 2 165 078 | 4/1986 | United Kingdom . |
| 2 177 838 | 1/1987 | United Kingdom . |
| WO 88/09268 | 12/1988 | WIPO . |
| WO 90/09730 | 8/1990 | WIPO . |

OTHER PUBLICATIONS

Miyata, et al., *"New High–Luminance Multicolor TFEL Devices . . . "*, Kanazawa Inst. of Tech., 1991, 286 SID 91 Digest, pp. 286–289.

Jones, R.W., *Fundamental Principles of Sol–Gel Technology,* The Institute of Metals, 1989.

Shoji, T., 1989, *"Bidirectional Push Pull Symmetric Driving Method of TFEL Display,"* Springer Proceedings in Physics, vol. 38, 1989, p. 324.

Sutton, S., and Shear, R., 1989. *"Recent Developments and Trends in Thin–Film Electroluminescent Display Drivers"*, Springer Proceedings in Physics, vol. 38, p. 318.

Bolger, S., Sevilla, L., and Williams, R., 1985. *"A Second––Generation Chip Set for Driving EL Panels"* SID 85 Digest.

Fukao, R., Fujikawa, H., Hamakawa, Y., 1989. Japanese Journal of Applied Physics. 28 (1989) Dec., No. 12, Part I., Tokyo, JP, pp. 2446–2449.

Nunomura, K., Sano, Y. and Utsumi, K., 1987. *"TFEL Character Module Using a Multilayer Ceramic Substrate"* SID 1987 Digest.

Kmetz, A.R.. "Flat–Panel Displays" *IEEE AES Magazine,* Aug. 1987, p. 19.

Pao, F.C., Tsang, F. and Numann, W.G. 1982. TENCON '82 Hong Kong, Session 2B, p. 51.

Balbimie, C. 1988. *"State Research Brings Benefits to Industry"* New Electronics, Jul./Aug. 1988, p. 49.

Matthewman, A., 1988. *"Flexible EL Technology"* New Electronics, May 1988, p. 50.

Wantanabe, H., Wantanabe, T. and Koizumi, N., 1988. *"Bare Chip Use in Vacuum Fluorescent Displays"*, JEE, Mar. 1988, p. 76.

Gielow, T., Holly, R. and Lanzinger, D. 1981. *"Monolithic Driver Chips for Matrixed Gray–Shaded TFEL Displays"*, SID 81 Digest, p. 24.

Greeneich, E.W., 1977. *"Thin–Film Video Scanner and Driver Circuit for Solid–State Flat–Panel Displays"* Proceedings of SID, vol. 18/1, First Quarter 1977, p. 114.

Engibous, T., and Draper, G., 1983. *"Flat Displays—An Alternative to CRTs?"* Computer Design, Sep. 1983, p. 199.

Takasaki, T., 1989. *"NEC's Chip–in–Glass Fluorescent Indicator Modules"*, JEE, Sep. 1989, p. 110.

Teggatz, R.E. 1989. *"A Power–Efficient 32–Bit Electroluminescent Display Column Driver"* SID 89 Digest, p. 68.

Alt, P.M., 1984. *"Thin-Film Electroluminescent Displays: Device Characteristics and Performance"*, Proceedings of the SID, vol. 25, 2, 1984, p. 123.

Greeneich, Edwin W., *"Thin-Film Video Scanner and Driver Circuit For Solid-State Flat Panel Displays"* IEEE Transactions of Electron Devices, vol. 24, No. 7, Jul., 1977, pp. 898–902.

Greeneich, E.W., *"Thin-Film Video Scanner and Driver Circuit for Solid-State Flat Panel Displays"*. pp. 16–19.

Raysby, Keith T., *"Reliable Interconnections to Plasma Display Panels Using Elastomeric Connectors"* Proceedings of the Technical Program, NEPCON East Conference, Jun. 1989, Boston, MA, pp. 448–457.

Buchoff, Leonard S., *"History and Overview of Display Connections"*. Proceedings of the Technical Program, NEPCON East Conference, Jun. 1989, Boston, MA, pp. 443–444.

PROCESS FOR LASER SCRIBING A PATTERN IN A PLANAR LAMINATE

This application is a divisional application of U.S. patent application Ser. No. 08/430,729, filed Apr. 28, 1995, which is a divisional application of U.S. patent application Ser. No. 08/052,702, filed Apr. 30, 1993, now U.S. Pat. No. 5,432, 015, which in turn is a continuation-in-part- of U.S. patent application Ser. No. 07/996,547, filed Dec. 24, 1992, now abandoned, which in turn was a continuation-in-part of U.S. patent application Ser. No. 07/880,436, filed May 8, 1992, now abandoned.

This invention relates to electroluminescent laminates and methods of manufacturing same. The invention also relates to electroluminescent display panels providing for electrical connection from the electroluminescent laminate to voltage driving circuitry. The invention further relates to laser scribing a pattern in a planar laminate such as the address lines of the transparent electrode of an electroluminescent laminate.

BACKGROUND OF THE INVENTION

Electroluminescence (EL) is the emission of light from a phosphor due to the application of an electric field. Electroluminescent devices have utility as lamps and displays. Currently, electroluminescent devices are used in flat panel display systems, involving either pre-defined character shapes or individually addressable pixels in a rectangular matrix.

Pioneering work in electroluminescence was done at GTE Sylvania. An AC voltage was applied to powder or dispersion type EL devices in which a light emitting phosphor powder was imbedded in an organic binder deposited on a glass substrate and covered with a transparent electrode. These powder or dispersion type EL devices are generally characterized by low brightness and other problems which have prevented widespread use.

Thin film electroluminescent (TFEL) devices were developed in the 1950's. The basic structure of an AC thin layer EL laminate is well known, see for example Tornqvist, R.O. "Thin-Film Electroluminescent Displays", Society for Information Display, 1989, International Symposium Seminar Lecture Notes, and U.S. Pat. No. 4,857,802 to Fuyama et al. A phosphor layer is sandwiched between a pair of electrodes and separated from the electrodes by respective insulating/dielectric layers. Most commonly, the phosphor material is ZnS with Mn included as an activator (dopant). The ZnS:Mn TFEL is yellow emitting. Other colour phosphors been developed.

The layers of conventional TFEL laminates are deposited on a substrate, usually glass. Deposition of the layers is done sequentially by known thin film techniques, for example electron beam (EB) vacuum evaporation or sputtering and, more recently, by atomic layer epitaxy (ALE). The thickness of the entire TFEL laminate is only in the order of one or two microns.

To separate and electrically insulate the phosphor layer from the electrodes, various insulating/dielectric materials are known and used, as discussed in more detail hereinafter.

Each of the two electrodes differ, depending on whether it is at the "rear" or the "front" (viewing) side of the device. A reflective metal, such as aluminum is typically used for the rear electrode. A relatively thin optically transmissive layer of indium tin oxide (ITO) is typically employed as the front electrode. In lamp applications, both electrodes take the form of continuous layers, thereby subjecting the entire phosphor layer between the electrodes to the electric field. In a typical display application, the front and rear electrodes are suitably patterned with electrically conductive address lines defining row and column electrodes. Pixels are defined where the row and column electrodes overlay. Various electronic display drivers are well known which address individual pixels by energizing one row electrode and one column electrode at a time.

While simple in concept, the development of thin film electroluminescent devices has met with many practical difficulties. A first difficulty arises from the fact that the devices are formed from individual laminate layers deposited by thin film techniques which are time consuming and costly techniques. A very small defect in any particular layer can cause a failure. Secondly, these thin-film devices are typically operated at relatively high voltages, eg. 300–450 volts peak to peak. In fact, these voltages are such that the phosphor layer is operated beyond its dielectric breakdown voltage, causing it to conduct. The thin-film dielectric layers on either side of the phosphor layer are required to limit or prevent conduction between the electrodes. The application of the large electric fields can cause electrical breakdown between the electrodes, resulting in failure of the device.

The present invention is particularly directed to the insulating/dielectric layers of electroluminescent devices and the prevention of electrical discharges across the phosphor layer. A requirement for successful operation of an electroluminescent device is that the electrodes (address lines) be electrically isolated from the phosphor layer. This function is provided by the insulating/dielectric layers. Typically, insulating/dielectric layers are provided on either side of the phosphor layer and are constructed from alumina, yttria, silica, silicon nitride or other dielectric materials. During operation of the device, electrons from the interface between the insulating layer and the phosphor layer are accelerated by the electric field as they pass through the phosphor layer, and collide with the dopant atoms in the phosphor layer, emitting light as a result of the collision process. In a conventional TFEL device, to ensure that the electric field strength across the phosphor is sufficiently high, the thickness of the dielectric layers is usually kept less than or comparable to that of the phosphor layer. If the dielectric layers are too thick a large portion of the voltage applied between the address lines is across the dielectric layers rather than across the phosphor layer.

It is important that the dielectric material be compatible with the phosphor layer. By "compatible", as used in this specification and in the claims, is meant that, firstly, it provides a good injectivity interface, i.e. a source of "hot" electrons at the phosphor interface which can be promoted or tunnelled into the phosphor conduction band to initiate conduction and light emission in the phosphor layer on application of an electric field. Secondly, within the meaning of compatible, the dielectric material must be chemically stable so that it does not react with adjacent layers, that is the phosphor or the electrodes.

In a typical TFEL, in order to achieve sufficient luminosity, the applied voltage is very near that at which electrical breakdown of the dielectric occurs. Thus, the manufacturing control over the thickness and quality of the dielectric and phosphor layers must be stringently controlled to prevent electrical breakdown. This requirement in turn makes it difficult to achieve high manufacturing yields.

A typical TFEL structure is constructed from the front (viewing) side to the rear. The thin layers are sequentially deposited on a suitable substrate. Glass substrates are utilized to provide transparency. The transparent, front electrode (ITO address lines) is deposited on the glass substrate by sputtering to a thickness of about 0.2 microns. The subsequent dielectric—phosphor—dielectric layers are then usually deposited by sputtering or evaporation. The thickness of the phosphor layer is typically about 0.5 microns. The dielectric layers are typically about 0.4 microns thick. The phosphor layer is usually annealed after deposition at about 450° C. to improve efficiency. The rear electrode is then added, typically in the form of aluminum address lines with a thickness of 0.1 microns. The finished TFEL laminate is encapsulated in order to protect it from external humidity. Epoxy laminated cover glass or silicon oil encapsulation are used. In that the initial substrate used for deposition is typically glass, the materials and deposition techniques employed in TFEL laminate construction cannot demand high temperature processing.

The high electric field strength used to operate a TFEL device puts heavy requirements on the dielectric layers. High dielectric strengths are required to avoid electrical breakdown. Dielectrics with high dielectric constants are preferred in order to provide luminosity at the lowest possible driving voltage. However, efforts to utilize high dielectric constant materials have not provided satisfactory results.

To lower the driving voltage of TFEL elements insulating layers have been constructed from higher dielectric constant materials, for instance $SrTiO_3$, $PbTiO_3$, and $BaTa_2O_3$, as reported in U.S. Pat. No. 4,857,802 issued to Fuyama et al. However, these materials have not performed well, exhibiting low dielectric breakdown strengths. In U.S. Pat. No. 4,857,802, a dielectric layer is formed from a perovskite crystal structure by controlled thin film deposition techniques to achieve an increased (111) plane orientation. The patent reports higher dielectric strengths (above about $8.0\times10^5$—about $1.0\times10^6$ V/cm) with a dielectric layer having a thickness of about 0.5 microns using $SrTiO_3$, $PbTiO_3$ and $BaTiO_3$, all of which have high dielectric constants and a perovskite crystal structure. This device still has the disadvantage of requiring complex and difficult to control thin film deposition techniques for the dielectric layer.

Efforts have also been made to develop TFEL devices using a thick ceramic insulator layer and a thin film electroluminescent layer, see Miyata, T. et al., SID 91 Digest, pp 70–73 and 286–289. The device is built up from a $BaTiO_3$ ceramic sheet. The sheet is formed by molding fine $BaTiO_3$ powder into disks (20 mm diameter) by conventional cold-press methods. The disks are sintered in air at 1300° C., then ground and polished into sheets with a thickness of about 0.2 mm. The emitting layer is deposited onto the sheet in a thin film using chemical vapour deposition or RF magnetron sputtering. Suitable electrode layers are then deposited by thin film techniques on either side of the structure. While this device exhibits certain desirable characteristics, it is not feasible to manufacture a commercial TFEL device from a solid ceramic sheet. Grinding and polishing a larger ceramic sheet to a consistent thickness of 0.2 mm is not practical economically.

It is also known in the art to use multiple insulating/dielectric layers on each side of the phosphor layer. For instance, U.S. Pat. No. 4,897,319 to Sun discloses a TFEL with an EL phosphor layer sandwiched between a pair of insulator stacks, in which one or both of the insulator stacks includes a first layer of silicon oxynitride (SION) and a second thicker layer of barium tantalate (BTO). The first, SiON layer provides high resistivity while the second, BTO layer has a higher dielectric constant. Overall, the structure is stated to produce a higher luminance of the phosphor layer at conventional voltages. However, the insulating layers are deposited by RF sputtering, which has the disadvantages of thin film techniques described hereinabove.

There is a need for a TFEL device having higher luminosity and lower operating voltage than conventional TFEL devices, while still being feasible to construct. It is necessary to achieve this with a dielectric layer which has a dielectric strength that is above the electric field strength needed to drive the device.

Fabricating electrode patterns in transparent conductor materials such as indium tin oxide often involves extensive and expensive masking, photolithographic and chemical etching processes. Lasers have been proposed for scribing such transparent conductor materials. Generally carbon dioxide, argon and YAG lasers are used. Such lasers produce light in the visible and infrared ranges of the electromagnetic spectrum (generally greater than 400 nm). However, there are problems in using such long wavelength light to scribe electrode patterns, particularly when the transparent conductor material is deposited on another transparent layer. In conventional TFEL displays, the transparent electrode material, typically indium tin oxide (ITO), is deposited on the transparent display glass (substrate) prior to depositing the remaining layers of the EL laminate. In an insulator or a semiconducting material, light with a wavelength longer than that corresponding to the energy of the electronic band gap in the material is not strongly absorbed. For optically transparent materials, the wavelength corresponding to the band gap is shorter than that for visible light. Therefore, transparent electrode materials show poor absorption of laser light due to both the long wavelength of the light and the thinness of the layer, making it difficult to utilize laser energy to directly ablate the electrode address lines.

U.S. Pat. No. 4,292,092, to Hanak and U.S. Pat. No. 4,667,058, to Catalano et al., disclose processes to pattern a transparent electrode pattern deposited on another transparent layer in a solar battery. The patents teach patterning the electrode using a pulsed YAG laser, which produces light with a wavelength too long to be significantly absorbed in any of the transparent layers. To compensate for the low absorption, a laser with high peak power is used to thermally vaporize the transparent electrode. A neodymium YAG laser is operated at 4–5 W with a pulse rate of 36 KHz at a scanning rate of 20 cm/sec. The examples of the patent disclose scribing an ITO layer deposited on glass in this manner. However, the scribed lines are described as having incompletely removed the ITO and, in places, as having melted the glass to a depth of a few hundred angstroms. The residual ITO must thereafter be removed by a subsequent etching step.

Other approaches to forming electrode patterns in transparent electrode materials involve using an excimer laser, which produces light of shorter wavelength, in the ultraviolet region of the electromagnetic spectrum. At this wavelength, the laser energy can be absorbed by the transparent electrode material. Lasers of this nature are suggested to form conductive patterns for liquid crystal displays (U.S. Pat. No. 4,970,366, to Imatou et al and U.S. Pat. No. 4,927,493, to Yamazaki et al.), photovoltaic batteries (U.S. Pat. No. 4,783,421, to Carlson et al. and U.S. Pat. No. 4,854,974, to Yamazaki et al.) imaging sensors (U.S. Pat. No. 5,043,567, to Sakama et al.), and integrated circuits (U.S. Pat. No. 5,109,149, to Leung). WO 90/0970, published Aug. 23, 1990, to Autodisplay A/S, discloses a process for scribing an electrode dot matrix pattern in a transparent conductor on a transparent substrate with an excimer laser.

While excimer lasers produce light which has a wavelength short enough to be absorbed by the transparent electrode such that the electrode may be patterned by direct ablation, such lasers are relatively expensive and the scribing process must be carefully controlled to avoid melting or ablating the underlying display glass. Furthermore, such processes may lead to excessive or incomplete ablation of the transparent electrode material. For instance in WO 90/0970 there is an indication that, in the event of partial removal of the material to be ablated, remaining portions may be removed by chemicals or plasma etching.

Another problem encountered in scribing transparent electrode materials on a transparent substrate is addressed in U.S. Pat. No. 4,937,129, to Yamazaki. To avoid diffusion or cross contamination between the layers, diffusion barrier layers are provided at the interface.

Other patents have taught surface treatments of the transparent electrode material to enhance absorption of the laser light. For instance, U.S. Pat. No. 4,909,895, to Cusano, teaches oxidizing the metallic film surface to make it less reflective of the laser light. U.S. Pat. No. 4,568,409, to Caplan, teaches coating the transparent layer to be ablated with a dye to selectively absorb laser light where ablation is desired.

Control circuitry to drive an EL display has been developed. Basically, the circuitry converts serial video data into parallel data to apply a voltage to the rows and columns of the display. State of the art row and column driver components (chips) are available.

Asymmetric and symmetric drive techniques are used with EL displays. In an asymmetric drive method, the EL panel is provided with drive pulses by applying a negative subthreshold voltage to one row at a time. During each row scan time, a positive voltage pulse is applied to the selected columns (i.e. those that should illuminate) and zero voltage is applied to the nonselected columns (i.e. those that should not illuminate). At the intersection of selected columns and rows, a voltage equal to the sum of the subthreshold row voltage and the positive pulse voltage on the column is applied across the pixel, causing light emission. After all rows of the panel have been addressed, a positive polarity refresh pulse is applied to all of the rows simultaneously, and all columns are held at 0 V.

In a symmetrical drive scheme, the refresh pulse is eliminated. Instead, a similar set of drive pulses that are of the opposite polarity are applied to the panel. To maintain the panel in operation, the rows are scanned with pulses of alternating polarity on even and odd frames. The alternating polarity produces a net zero charge on all display pixels.

State of the art high voltage driver components (chips) are available for both asymmetric and symmetric drive techniques.

Alternate driving circuits and components for EL displays are known or are in development, see for example K. Shoji et al, Bidirectional Push-Pull Symmetric Driving Method of TFEL Display, Springer Proceedings in Physics, Vol. 38, 1989, 324: and Sutton S. et al, Recent Developments and Trends in Thin-Film Electroluminescent Display Drivers, Springer Proceedings in Physics, Vol. 38, 1989, 318; and Bolger et al, A Second Generation Chip Set for Driving EL Panels, SID, 1985, 229.

The above driving schemes are termed multiplexed (passive) matrix addressing schemes. Theoretically, other types of driving schemes, such as active matrix addressing schemes, could be used with EL displays. However, these are not yet developed. Such alternate driving schemes should be considered to be within the meaning of the phrase voltage driving circuitry as used in this application.

In conventional EL displays, one method to connect the column and row address lines to the driver circuit is to compress a polymeric strip containing very many closely spaced metal sheets between rows of contacts connected to the display address lines and rows of contacts connected to the driver components of the driver circuit, which is constructed on a separate circuit board (see U.S. Pat. No. 4,508,990, to Essinger). The polymeric strip is a layered elastomeric element (LEE), known by such tradenames as STAX and ZEBRA. The LEE is composed of alternating layers of conductive and non-conductive elastomeric materials. The polymeric strip avoids the need to laboriously connect hundreds of individual wires using solder or welded connections to the contacts. However, this interconnection technology is unreliable, and does not function well at high temperatures, which can cause the polymeric material to creep.

Another method that is commonly used to connect column and row address lines to the driver circuit for liquid crystal displays (LCDs) is being considered for electroluminescent displays, namely chip-on-glass (COG) technology. The driver components (chips) to which the address lines must be connected are mounted around the periphery of the display. In the case of LCDs, the address lines, which are evaporated on the rear side of the display glass, are extended from the active region of the display so that they end in contact pads that are arranged in a pattern so that the chips can be wire bonded thereto. Wire bonding entails mounting the chips on the display glass and then individually welding fine gold wires to the output pads on the chip and to the corresponding contact pads on the address lines.

The advantage of COG technology is that the number of contacts between the display glass and the driver circuit are substantially reduced, since by far the largest number of contacts are between the driver chips and the address lines. There are typically only about 20 to 30 connections between the driver chips and the rest of the driving circuit as opposed to up to 2000 connections to the address lines.

One major disadvantage of the COG technology is that difficulty is experienced in wire bonding the driver chips to connect them to the thin film pads on the address lines, resulting in poor manufacturing yields. Another disadvantage is that space is required around the perimeter of the display to mount the driver chips, thus increasing the bulkiness of the displays and eliminating any possibility of joining several display modules in an array to form a larger display.

Through hole technology for direct circuit connections is widely known in the semiconductor art (see for example U.S Pat. No. 3,641,390, Nakamura). U.S. Pat. No. 4,710,395, to Young et al, describes methods and apparatus for through hole substrate printing with regulated vacuum. However, through hole printing has not, to the inventors' knowledge, been successfully applied to EL displays.

U.S. Pat. No. 3,504,214 to Lake et al describes a segmented storage type of EL device in which pixels are turned on with light to make a photoconductive layer next to the phosphor layer become electrically conductive. Complex through hole conductors are described. The patent indicates that ordinary through hole connections do not work with high resolution TFEL displays because the conductive material might react with the phosphor, thereby degrading the performance of the display.

SUMMARY OF THE INVENTION

Layers of a electroluminescent laminate have different dielectric constants. A potential difference across the layers of the laminate is divided proportionately across each layer in accordance with the thickness of each layer, and inversely with the relative dielectric constants of the materials. For instance, if one layer has a thickness and a dielectric constant that are both twice that of the other layer, the voltage would be divided equally between the two layers. The present invention uses this property to combine a thick dielectric layer having a high dielectric constant with a thinner phosphor layer having a substantially lower dielectric constant. In this way, prior to the initiation of conduction through the phosphor layer, the voltage across a pixel can be largely across the phosphor layer, provided the dielectric layer has a sufficiently high dielectric constant.

The present invention provides an EL laminate, and method of manufacturing same, with a novel and improved dielectric layer. The dielectric layer is formed as a thick layer from a ceramic material to provide:

- a dielectric strength greater than about $1.0\times10^6$ V/m;
- a dielectric constant such that the ratio of the dielectric constant of dielectric material ($k_2$) to that of the phosphor layer ($k_1$) is greater than about 50:1 (preferably greater than 100:1);
- a thickness such that the ratio of the thickness of the dielectric layer ($d_2$) to that of the phosphor layer ($d_1$) is in the range of about 20:1 to 500:1 (preferably 40:1 to 300:1); and
- a surface adjacent the phosphor layer which is compatible with the phosphor layer and sufficiently smooth that the phosphor layer illuminates generally uniformly at a given excitation voltage.

The laminate including the dielectric layer of the present invention is most preferably one in which the phosphor layer is a thin film layer. A typical thin film phosphor layer is formed from ZnS:Mn with a thickness of about 0.2 to 2.0 microns, typically about 0.5 microns. The material ZnS:Mn has a dielectric constant of about 5 to 10. From theoretical calculations, based on this most preferred phosphor layer (see guidelines set out hereinabove), the dielectric layer of the present invention preferably has a dielectric constant greater than about 500, and most preferably greater than about 1000, and a thickness in the range of about 10–300 microns and preferably in the range of 20–150 microns. To achieve the high dielectric constant, ferroelectric materials, are preferred, most preferably those having a perovskite crystal structure. Exemplary materials include $PbNbO_3$, $BaTiO_3$, $SrTiO_3$, and $PbTiO_3$.

The dielectric layer of this invention is formed in a laminate which is constructed from the rear to the front. The rear electrode is thus deposited on a substrate, most preferably a ceramic such as alumina, which can withstand higher temperatures in manufacture than can glass substrates (used in front to rear TFEL construction in order to provide front transparency). The dielectric layer oft he invention is then deposited, by thick film techniques, on the rear electrode. It is then sintered at a high temperature, but one which can be withstood by the substrate and rear electrode. The use oft hick film techniques and high temperature sintering is important to the overall properties of the dielectric layer because a dense layer with a high degree of crystallinity is achieved, which improves the overall dielectric constant and dielectric strength of the layer.

In practice, the inventors have found that it is difficult to produce the desired surface of the dielectric adjacent the phosphor layer (i.e. compatible and smooth) with the presently available ceramic materials. Thus, in a preferred embodiment of the invention, the dielectric layer is formed as two layers, a first dielectric layer formed on the rear electrode and having the preferred high dielectric strength and dielectric constant values set out hereinabove, and a second dielectric layer which provides the surface adjacent the phosphor layer as set out above.

In a preferred embodiment of the invention, the first dielectric layer is deposited by thick film techniques (preferably screen printing) followed by high temperature sintering (preferably less than the melting point of all lower layers, typically less than 1000° C.). Pastes containing ferroelectric ceramics, preferably having perovskite crystal structures, as set above are preferred materials, provided the paste formulation permits sintering at the high sintering temperature. The second dielectric layer is preferably deposited by sol gel techniques, followed by high temperature sintering, to provide a smooth surface. The material used in the second layer preferably provides a high dielectric constant (preferably greater than 20, more preferably greater than 100) and a thickness greater than 2 microns (preferably 2–10 microns). Ferroelectric ceramics with perovskite, crystal structures are most preferred.

The invention has been demonstrated with a first dielectric layer screen printed from lead niobate with a thickness of 30 microns, and a second dielectric layer spin deposited as a sol from lead zirconate titanate with a thickness of 2–3 microns. The sol gel layer has also been demonstrated by dipping to form several layers with a total thickness of 6–10 microns. Lead lanthanum zirconate titanate is also demonstrated as a sol gel layer.

The use of a two layer dielectric, while not essential, has its advantages. While the first dielectric layer is formed as a thick layer with the needed high dielectric strength and high dielectric constant, the second layer is not so limited. Provided the second layer has the desired compatible and smooth surface, it can be formed as a thinner layer from different materials than used in the first layer. Much research has been done on altering the properties of the dielectric—phosphor interface of EL laminates, for instance to improve chemical stability or injectivity. Materials or deposition techniques including these improvements can be used with the first and/or second dielectric layers of this invention, for instance in the choice of materials or deposition techniques used in the first or second layer, by altering the surface of the second layer, or by applying a further thin film layer of a third material above the first or second layer.

Laminates made in accordance with the present invention have been demonstrated to exhibit good luminosity without breakdown at low operating voltages. The preferred thick film and sol gel deposition techniques for the dielectric layer(s) are generally simple and inexpensive techniques compared to the thin film techniques described hereinabove. Another advantage of the dielectric layer(s) of this invention is that laminates incorporating the layer(s) do not require a further dielectric layer between the phosphor layer and the second electrode, although such a further dielectric layer may be included if desired.

Thus, in one broad aspect, the invention provides a dielectric layer in an electroluminescent laminate of the type including a phosphor layer sandwiched between a front and a rear electrode, the rear electrode being formed on a substrate and the phosphor layer being separated from the rear electrode by a dielectric layer. The dielectric layer comprises a planar layer formed from a ceramic material providing a dielectric strength greater than about $1.0\times10^6$ V/m and a dielectric constant such that the ratio of $k_2/k_1$ is greater than about 50:1, the dielectric layer having a thickness such that the ratio of $d_2:d_1$ is in the range of about 20:1 to 500:1, and the dielectric layer having a surface adjacent the phosphor layer which is compatible with the phosphor layer and sufficiently smooth that the phosphor layer illuminates generally uniformly at a given excitation voltage.

The invention also broadly extends to a method of forming a dielectric layer in an electroluminescent laminate of the type including a phosphor layer sandwiched between a front and a rear electrode, the rear electrode being formed on a substrate and the phosphor layer being separated from the rear electrode by a dielectric layer. The method comprises depositing on the rear electrode, by thick film techniques followed by sintering, a ceramic material having a dielectric constant such that the ratio of $k_2/k_2$ is greater than about 50:1, to form a dielectric layer having a dielectric strength greater than about $1.0\times10^6$ V/m and a thickness such that the ratio of $d_2/d_1$ is in the range of about 20:1 to 500:1, the dielectric layer forming a surface adjacent the phosphor layer which is compatible with the phosphor layer and sufficiently smooth that the phosphor layer illuminates generally uniformly at a given excitation voltage.

This invention also broadly provides a process for laser scribing a pattern in a planar laminate having at least one overlying layer and at least one underlying layer, comprising:

applying a focused laser beam on the overlying layer side of the laminate, said laser beam having a wavelength which is substantially unabsorbed by the overlying layer but which is absorbed by the underlying layer, such that at least a portion of the underlying layer is directly ablated and the overlying layer is indirectly ablated throughout its thickness.

In the context of an EL laminate, the overlying layers are the transparent conductive material and the phosphor, the underlying layers are one or more dielectric layers and the pattern is an electrode pattern of parallel spaced address lines.

Throughout the specification and the claims, the following definitions apply:

Absorption occurs in a material when a quantum of radiant energy coincides with an allowed transition within the material to a higher energy state, for example by promotion of electrons across the band gap for that material.

Direct ablation of a material by a laser beam occurs when the dominant cause of ablation is decomposition and/or due to absorption of the radiant energy of the laser beam by the material.

Indirect ablation of a material by a laser beam occurs when the dominant cause of ablation is vaporization due to heat generated in, and transported from, an adjacent material which absorbs the radiant energy of the laser beam.

The invention also extends to an electroluminescent display panel providing for electrical connection from a planar electroluminescent laminate to the output of one or more voltage driving components of a driver circuit using through hole connectors. The display panel includes:

an electroluminescent laminate formed on a rear substrate and having front and rear sets of intersecting address lines such as is known in the art;

a plurality of through holes formed in the substrate adjacent the ends of the address lines; and means forming a conductive path through each of the through holes in the substrate to the ends of each of the address lines to provide for electrical connection of each address line to a voltage driving component of the driving circuit.

Preferably, the electroluminescent laminate of the display panel includes the thick film dielectric layer of the present invention. This dielectric layer enables the laminate to be constructed from the rear substrate toward the front viewing side, which in turn enables the through hole connectors and thick film circuit patterns for connection to the voltage driving components and address likes to be formed by interleaving the circuit fabrication steps with the fabrication steps for the electroluminescent laminate. Such steps could not easily be accomplished in the construction of a conventional electroluminescent laminate since the layers are deposited on the front display glass which will not withstand temperatures to fire thick film conductive pastes.

In accordance with the present invention, the voltage driving components or the entire driving circuit may be formed on the rear (reverse) side of the rear substrate. The use of through hole connectors provides for more direct, highly reliable interconnections between the address lines and the driving circuit. A non-active perimeter around the display panel, as is needed in the prior art, is not needed. This facilitates the assembly of large displays from individual display panels without dark boundaries between the modules.

DESCRIPTION OF THE PREFERRED EMBODIMENTS

Figure 1:
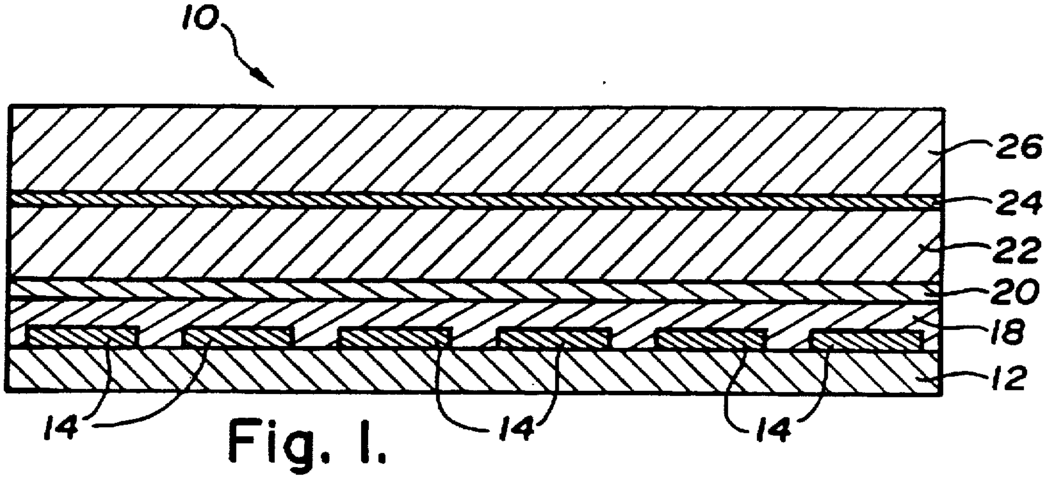
FIG. 1 is a schematic, cross sectional view of the laminate structure including a two layer dielectric of the present invention.
Figure 2:
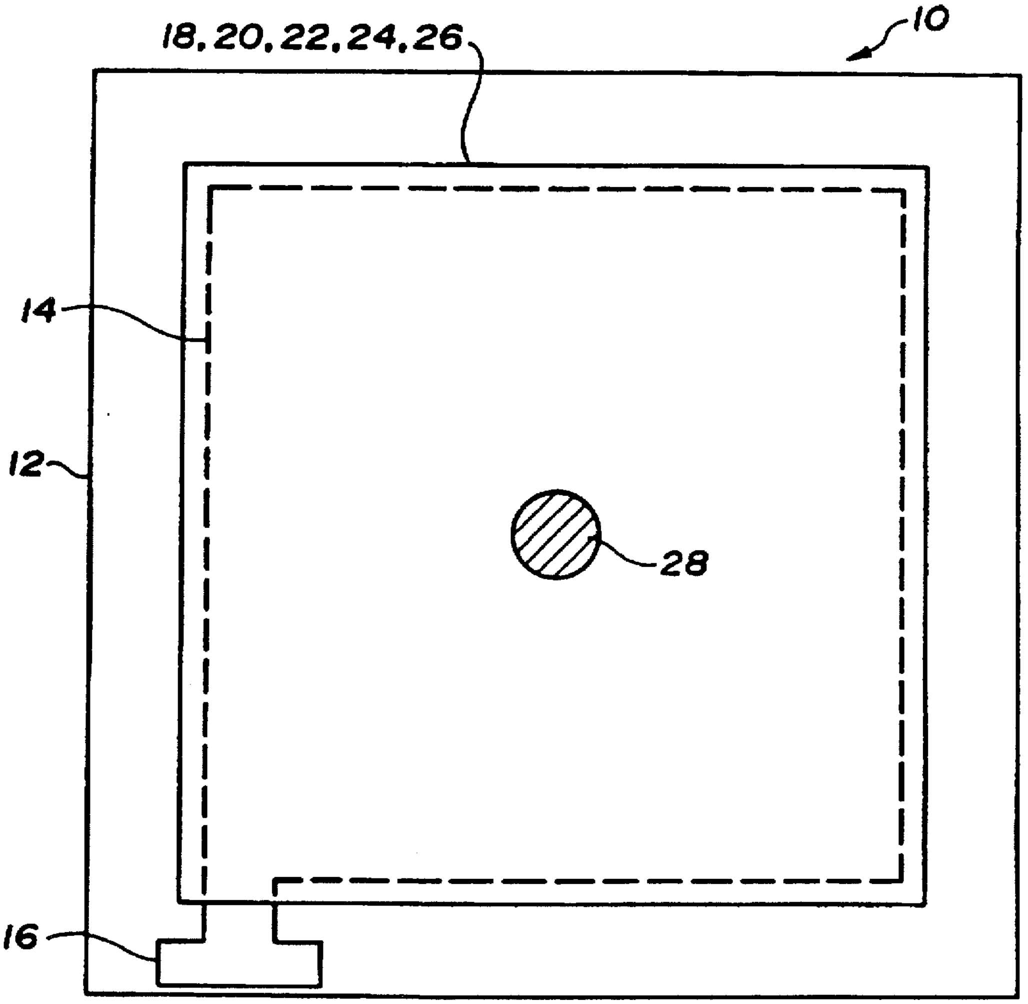
FIG. 2 is a top view of the laminate structure of FIG. 1.
Figure 3:
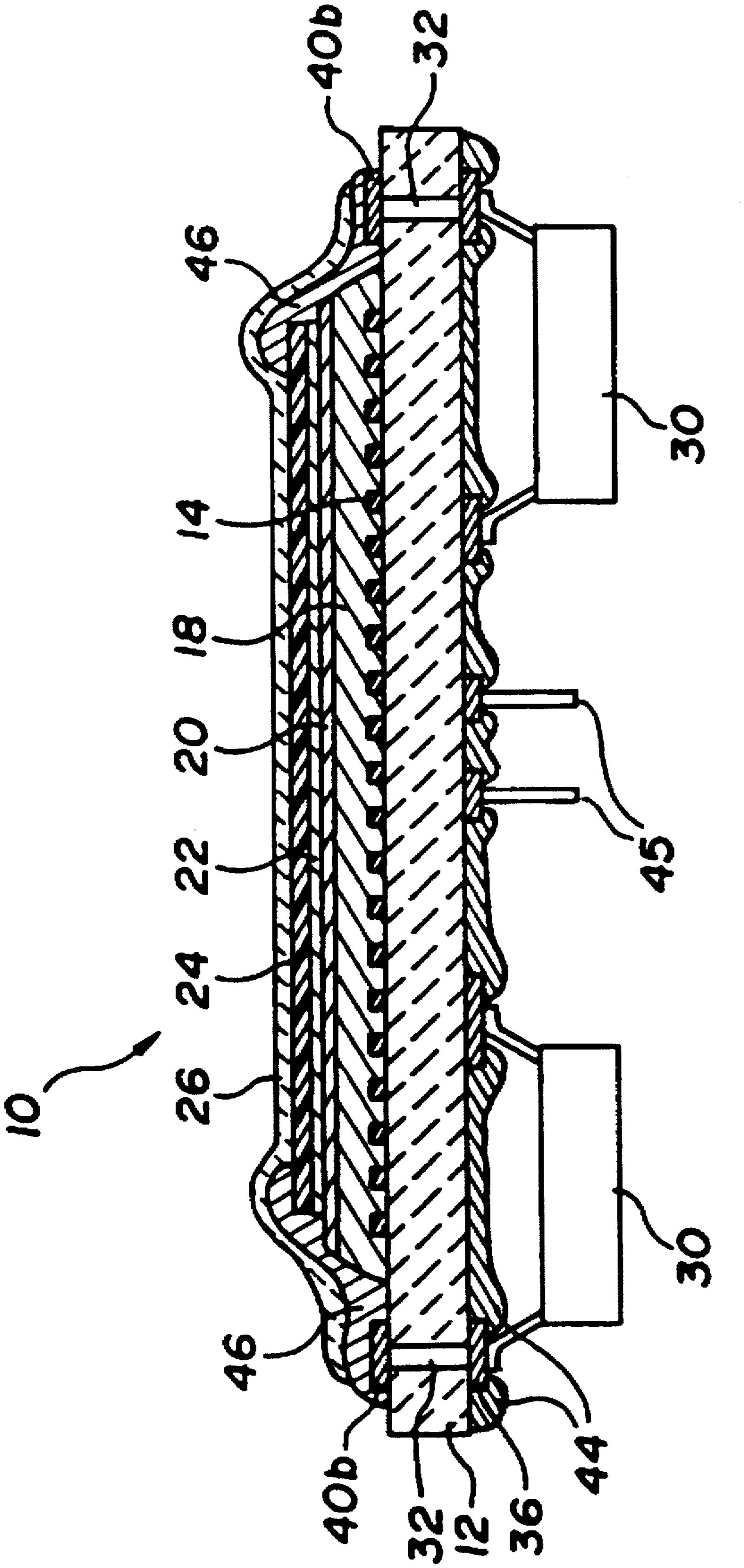
FIG. 3 is a schematic cross sectional view of the laminate structure along a column electrode showing the preferred embodiment of connecting the row and column electrode address lines to the voltage driving components of the voltage driving circuit.

An EL laminate 10 incorporating a two layer dielectric in accordance with the present invention is illustrated in FIGS. 1 and 2. The laminate 10 is built from the rear side on a substrate 12. A rear electrode layer 14 is formed on the substrate 12. As shown in the Figures, for display applications, the rear electrode 14 consists of rows of conductive address lines centered on the substrate 12 and spaced from the substrate edges. A electric contact tab 16 protrudes from the electrode 14. A first, thick dielectric layer 18 is formed above the rear electrode 14, followed by a second, thinner dielectric layer 20. A phosphor layer 22 is formed above the second dielectric layer 20, followed by a front, transparent electrode layer 24. The front electrode layer 24 is shown in the Figures as solid, but in actuality, for display applications, it consists of columns of address lines arranged perpendicular to the address lines of the rear electrode 14. The laminate 10 is encapsulated with a transparent sealing layer 26 to prevent moisture penetration. An electric contact 28 is provided to the second electrode 24.

The EL laminate 10 is operated by connecting an AC power source to the electrode contacts 16, 28. An EL laminate in accordance with the invention has utility as lamps or displays, although it will most frequently find application in displays.

It will be understood by persons skilled in the art that further intervening layers can be included in the laminate 10 without departing from the present invention.

A method of constructing a double dielectric layer in an EL laminate, in accordance with the invention, will now be described with preferred materials and process steps.

The laminate 10 is constructed from the rear to the front (viewing) side. The laminate 10 is formed on a suitable substrate 12. The substrate 12 is preferably a ceramic which can withstand the high sintering temperatures (typically 1000° C.) used in the dielectric layer. Alumina is most preferred.

Deposited on the substrate 12 is the first, rear electrode 14. Many techniques and materials are known for laying down thin rows of address lines. Preferably, conductive metal address lines are screen printed from a Ag/Pt alloy paste, using an emulsion which can be washed away in the areas where the paste is to be printed. The paste is thereafter dried and fired. Alternatively, the rear electrode 14 may be formed from other noble metals such as gold, or other metals such as chromium, tungsten, molybdenum, tantalum or alloys of these metals.

The first dielectric layer 18 is deposited on the rear electrode by known thick film techniques. The first dielectric layer 18 is preferably formed from a ferroelectric material, most preferably one having a perovskite crystal structure, to provide a high dielectric constant compared to that of the phosphor layer 22. The material will have a minimum dielectric constant of 500 over a reasonable operating temperature for the laminate, generally 20°–100° C. More preferably, the dielectric constant of the first dielectric layer material is 1000 or greater. Exemplary materials for the first dielectric layer 18 include $PbNbO_3$, $BaTiO_3$, $SrTiO_3$, and $PbTiO_3$, $PbNbO_3$ being particularly preferred.

As will be understood by persons skilled in this art, in choosing a ceramic material (i.e. an electrical insulating material having a melting point which is sufficiently high to allow for the preparation of the other layers of the laminate) for the first dielectric layer 18, one chooses materials known to have high dielectric constants and dielectric strengths. These are intrinsic properties of the materials, however, the values are generally given for bulk materials, which are present in a dense, highly crystalline form. The deposition techniques used can alter these properties. In respect of the dielectric constant of the material, the thick film deposition techniques, followed by high temperature sintering, will generally preserve a large particle size (in the range of about 1 micron to about 2 microns) and a high degree of crystallinity in a dense structure, so as not to significantly lower the dielectric constant from that of the starting material. Similarly, a high dielectric strength is achieved using thick film deposition techniques followed by high temperature sintering. However, the dielectric strength of the layer(s) should ultimately be measured by imposing an operating voltage across the completed laminate.

Thick film deposition techniques are known in the art, as set forth above. By such techniques, the dielectric material is deposited on the rear electrode layer 14 to the desired thickness with generally uniform coverage. Thick film deposition techniques are frequently used in the manufacture of electronic circuits on ceramic substrates. Screen printing is the most preferred technique. Commercially available dielectric pastes can be used, with the recommended sintering steps set out by the paste manufacturers. Pastes should be chosen or formulated to permit sintering at a high temperature, typically about 1000° C. However, other techniques can achieve similar results. One alternate thick film technique is the use a dielectric as a "green tape", such that it can be laid down on the rear electrode 14. The green tape comprises a dielectric powder in a polymeric matrix that can be burned out during the subsequent sintering process. The tape is flexible before sintering, and can be rolled or pressed onto the electrode layer 14. One possible advantage of the green tape over the screen printed dielectric is that it may be somewhat more dense with fewer pores once it is fired. At present, green tape dielectrics are not widely available. Thick film pastes of the dielectric can also be roll coated onto the rear electrode layer 14, or applied with a doctor blade. More complex techniques such as electrostatic deposition of a dielectric powder followed by immediate sintering before the powder loses its electrostatic charge may also by used.

As indicated, the first dielectric layer 18 is preferably screen printed from a paste. Depositing in multiple layers followed by sintering at a high temperature is preferred in order to achieve low porosity, high crystallinity and minimal cracking. The sintering temperature will depend on the particular material being used, but will not exceed the temperature which the rear electrode 14 or substrate 12 can withstand. A temperature of 1000° C. is typically the maximum for most electrode materials. The thickness of the first dielectric layer 18 will vary with its dielectric constant and with the dielectric constants and thicknesses of the phosphor layer 22 and the second dielectric layer 20. Generally, the thickness of the first dielectric layer 18 is in the range of 10 to 300 microns, preferably 20–150, microns, and more preferably 30–100 microns.

It will be appreciated that, in general, the criteria for establishing the thickness and dielectric constant of the dielectric layer(s) are calculated so as to provide adequate dielectric strength at minimal operating voltages. The criteria are interrelated, as set forth below. Given a typical range of thickness for the phosphor layer ($d_1$) of between about 0.2 and 2.0 microns, a dielectric constant range for the phosphor layer ($k_1$) of between about 5 and 10 and a dielectric strength range for the dielectric layer(s) of about $10^6$ to $10^7$ V/m, the following relationships and calculations can be used to determine typical thickness ($d_2$) and dielectric constant ($k_2$) values for the dielectric layer of the present invention. These relationships and calculations may be used as guidelines to determine $d_2$ and $k_2$ values, without departing from the intended scope of the present invention, should the typical ranges set out hereinabove change significantly.

The applied voltage V across a bilayer comprising a uniform dielectric layer and a uniform non-conducting phosphor layer sandwiched between two conductive electrodes is given by equation 1:

$$V=E_2*d_2+E_1*d_1 \quad (1)$$

wherein:

$E_2$ is the electric field strength in the dielectric layer;

$E_1$ is the electric field strength in the phosphor layer;

$d_2$ is the thickness of the dielectric layer; and $d_1$ is the thickness of the phosphor.

In these calculations, the electric field direction is perpendicular to the interface between the phosphor layer and the dielectric layer. Equation 1 holds true for applied voltages below the threshold voltage at which the electric field strength in the phosphor layer is sufficiently high that the phosphor begins to break down electrically and the device begins to emit light.

From electromagnetic theory, the component of electric displacement D perpendicular to an interface between two insulating materials with different dielectric constants is continuous across the interface. This electric displacement component in a material is defined as the product of the dielectric constant and the electric field component in the same direction. From this relationship equation 2 is derived for the interface in the bilayer structure:

$$k_2*E_2=k_1*E_1 \quad (2)$$

wherein:

$k_2$ is the dielectric constant of the dielectric material; and $k_1$ is the dielectric constant of the phosphor material.

Equations 1 and 2 can be combined to give equation 3:

$$V=(k_1*d_2/k_2+d_1)*E_1 \quad (3)$$

To minimize the threshold voltage, the first term in equation 3 needs to be as small as is practical. The second term is fixed by the requirement to choose the phosphor thickness to maximize the phosphor light output. For this evaluation the first term is taken to be one tenth the magnitude of the second term. Substituting this condition into equation 3 yields equation 4:

$$d_2/k_2=0.1*d_1/k_1 \quad (4)$$

Equation 4 establishes the ratio of the thickness of the dielectric layer to its dielectric constant in terms of the phosphor properties. This thickness is determined independently from the requirement that the dielectric strength of the layer be sufficient to hold the entire applied voltage when the phosphor layer becomes conductive above the threshold voltage. The thickness is calculated using equation 5:

$$d_2=V/S \quad (5)$$

wherein:

S is the strength of the dielectric material.

Use of the above equations and reasonable values for $d_1$, $k_1$, and S provides the range of dielectric layer thickness and dielectric constant set forth in this specification and claims.

As stated previously, a second dielectric layer 20 is not needed if the first dielectric layer 22 provides a surface adjacent the phosphor layer which is sufficiently smooth (i.e. a subsequently deposited phosphor layer will illuminate generally uniformly at a given excitation voltage) and is compatible with the phosphor layer 22. Generally, a surface relief that does not vary more than about 0.5 microns over about 1000 microns (which equates approximately to a pixel width) is sufficient. A surface relief of 0.1–0.2 microns over that distance is more preferred. If the first dielectric layer 18 provides a sufficiently smooth surface, but does not provide the desired compatibility with the phosphor layer 22, a further layer of material (preferably, but not necessarily a dielectric material) to provide that compatibility may be added, for instance by thin film techniques.

In the event that the second dielectric layer 20 is needed, it is formed on the first dielectric layer 18. The second layer 20 may have a lower dielectric constant than that of the first dielectric layer 18 and will typically be formed as a much thinner layer (preferably greater than 2 microns and more preferably 2–10 microns). The desired thickness of second dielectric layer is generally a function of smoothness, that is the layer may be as thin as possible, provided a smooth surface is achieved. To provide a smooth surface, sol gel deposition techniques are preferably used, followed by high temperature sintering. Sol gel deposition techniques are well understood in the art, see for example "Fundamental Principles of Sol Gel Technology", R. W. Jones, The Institute of Metals, 1989. In general, the sol gel process enables materials to be mixed on a molecular level in the sol before being brought out of solution either as a colloidal gel or a polymerizing macromolecular network, while still retaining the solvent. The solvent, when removed, leaves a solid with a high level of fine porosity, therefore raising the value of the surface free energy, enabling the solid to be sintered and densified at lower temperatures than obtainable using most other techniques.

The sol gel materials are deposited on the first dielectric layer 18 in a manner to achieve a smooth surface. In addition to providing a smooth surface, the sol gel process facilitates filling of pores in the sintered thick film layer. Spin deposition or dipping are most preferred. These are techniques used in the semiconductor industry for many years, mainly in photolithography processes. For spin deposition, the sol material is dropped onto the first dielectric layer 18 which is spinning at a high speed, typically a few thousand RPM. The sol can be deposited in several stages if desired. The thickness of the layer 20 is controlled by varying the viscosity of the sol gel and by altering the spinning speed. After spinning, a thin layer of wet sol gel is formed on the surface. The sol gel layer 20 is sintered, generally at less than 1000° C., to form a ceramic surface. The sol may also be deposited by dipping. The surface to be coated is dipped into the sol and then pulled out at a constant speed, usually very slowly. The thickness of the layer is controlled by altering the viscosity of the sol and the pulling speed. The sol may also be screen printed or spray coated, although it is more difficult to control the thickness of the layer with these techniques.

The material used in the second dielectric layer 20 is preferably a ferroelectric ceramic material, preferably having a perovskite crystal structure to provide a high dielectric constant. The dielectric constant is preferably similar to that of the first dielectric layer material in order to avoid voltage fluctuations across the two dielectric layers 18, 20. However, with a thinner layer being utilized in the second dielectric 20, a dielectric constant as low as about 20 may be used, but will preferably be greater than 100. Exemplary materials include lead zirconate titanate (PZT), lead lanthanum zirconate titanate (PLZT), and the titanates of Sr, Pb and Ba used in the first dielectric layer 18, PZT and PLZT being most preferred.

PZT or PLZT are preferably deposited as a sol gel by spin deposition followed by sintering at less than about 600° C., to form a smooth ceramic surface suitable for deposition of the next layer.

The next layer to be deposited will typically be the phosphor layer 22, however, as set out hereinabove, it is possible, within the scope of this invention to include a further layer above the second dielectric layer 20 to further improve the interface with the phosphor layer. For instance, a thin film layer of material known to provide good injectivity and compatibility may be used.

The phosphor layer 22 is deposited by known thin film deposition techniques such as vacuum evaporation with an electron beam evaporator, sputtering etc. The preferred phosphor material is ZnS:Mn, but other phosphors that emit light of different colours are known. The phosphor layer 22 typically has a thickness of about 0.5 microns and a dielectric constant between about 5 and 10.

A further transparent dielectric layer above the phosphor layer 22 is not needed, but may be included if desired.

The front electrode layer 24 is deposited directly on the phosphor layer 22 (or the further dielectric layer if included). The front electrode is transparent and is preferably formed from indium tin oxide (ITO) by known thin film deposition techniques such as vacuum evaporation in an electron beam evaporator.

The laminate 10 is typically annealed and then sealed with a sealing layer 26, such as glass.

A preferred laminate, from rear to front, with typical thickness values in accordance with the present invention is as follows:

Substrate Layer—Alumina
Rear Electrode—Ag/Pt Address lines—10 microns
First Dielectric Layer—Lead Niobate—30 microns
Second Dielectric Layer—Lead Zirconate Titanate—2 microns
Phosphor Layer—ZnS:Mn—0.5 microns
Front Electrode—ITO—0.1 microns
Sealing Layer—Glass—10–20 microns.

In larger EL displays, the thicknesses of the layers may vary. For instance, the sol gel layer thickness is typically increased to about 6–10 microns to provide the desired smoothness. Similarly, the ITO layer thickness might be increased up to 0.3 microns in a larger display.

In accordance with the present invention the connection of the front and rear address lines of an electroluminescent laminate to the voltage driver circuit is preferably achieved using the through hole in the rear substrate. Most preferably, the EL laminate includes the thick dielectric layer of this invention, although this is not necessary.

Voltage driver circuitry includes voltage driving components (typically referred to as high voltage driver chips), the outputs of which are connected to the individual row and column address lines of the rear and front electrodes in order to selectively activate pixels in accordance with the video input signals. The voltage driver circuitry and components are generally known in the art. To illustrate the present invention, through hole connections were provided for known packaged high voltage driver chips which are to be surface mounted on the rear substrate by known reflow soldering techniques. Such high voltage driver chips are known for the conventional symmetric pulse driving schemes and for asymmetric pulse driving schemes.

However, it will be realized by those skilled in the art that the particular driver circuitry or driver components may be varied and as such will naturally affect the patterns of through holes and the circuit patterns provided for connection to the driver circuitry. The invention has application whether the entire driving circuit or only a portion thereof is to be mounted on the rear substrate. For instance, instead of using the high voltage packaged chips, it is possible to use bare silicon die (chips) on the substrate using conventional die attach methods, and using conventional wire bonding techniques to connect the chips to the drive circuitry on the substrate. In this case, the driver chips would occupy much less area on the substrate and it would be possible to place all of the drive circuitry on the substrate. The result is an ultra thin display panel that could be interfaced directly to a video signal and connected directly to a dc power supply. Such displays would be useful in ultra thin portable products that require a display. Of course, the ability to mount driving circuitry on the rear of the substrate is tied to the overall size of the display, a larger display providing more space for the drive circuitry directly on the rear of the substrate.

The circuit connection aspect of this invention is illustrated in FIGS. 3–10. As indicated above, particular through hole and circuit patterns are provided for illustration purposes for mounting high voltage driver chips 30 on the reverse side of the rear substrate. The particular chips chosen were Supertex HV7022PJ chips to connect to the row address lines 14 and Supertex HV8308PJ and HV8408PJ (Supertex Inc. is located in Sunnyvale, Calif.) for connection to the column address lines 24. The latter two chips differ in that the lead pattern of one is a mirror image of the lead pattern of the other.

Figure 4:
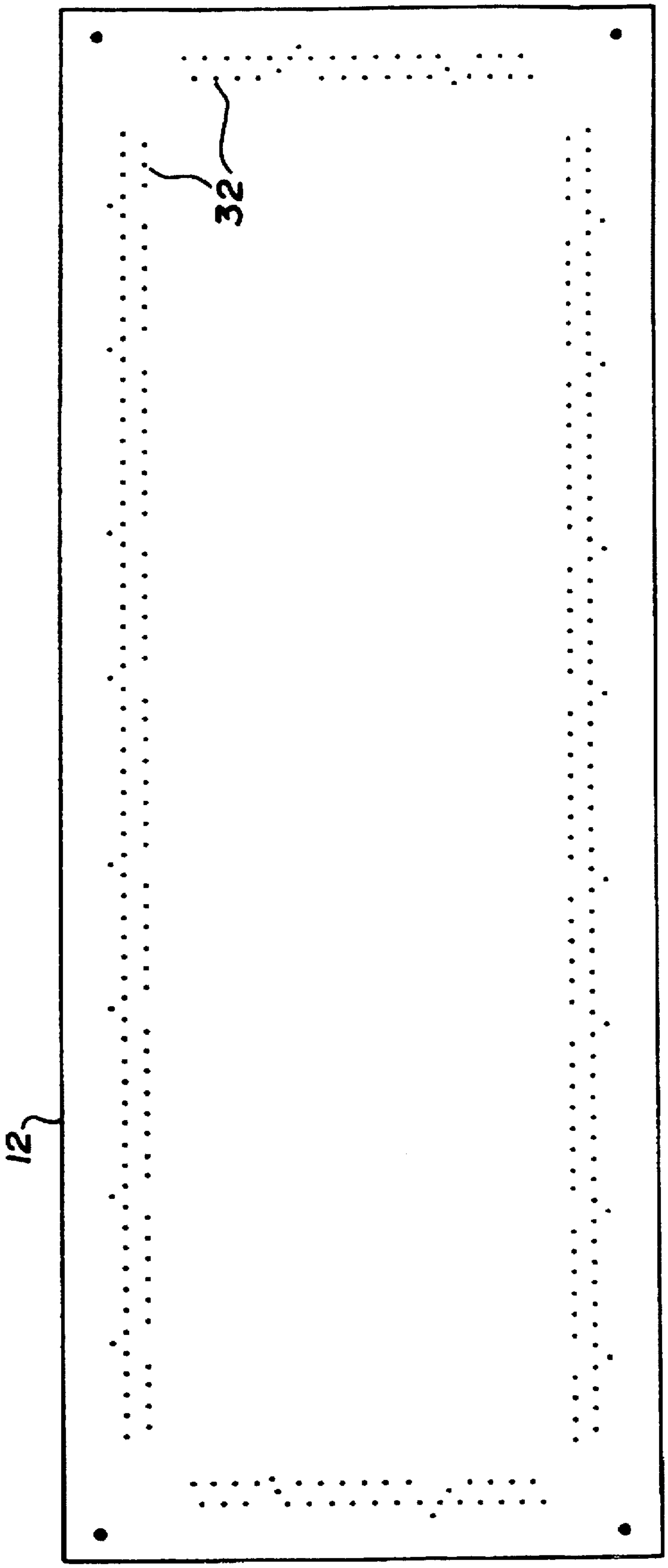
FIG. 4 is a top view of the rear substrate with the preferred pattern of through holes for electrical connection of the address lines to the voltage driving components of the driver circuit.

Referring to the Figures, the EL laminate 10 is preferably, but not necessarily, constructed with the two layer dielectric layers 18, 20 of this invention, and is thus constructed from the rear substrate 12 toward the front viewing side. The rear substrate 12 is drilled with through holes 32 in a pattern such that they will be proximate the ends of the address lines 14, 24 (subsequently formed). Alternatively, additional through holes could be provided in a spaced relationship along the address lines. This would be useful to provide connection to front ITO address lines which have high resistivity. The pattern of FIG. 4 provides for connection to an EL laminate 10 on a rectangular substrate 12, with row address lines (rear electrode) 14 along the longer dimension and column address lines (front electrode) 24 along the shorter dimension.

The through holes 32 are preferably formed by laser. The holes 32 are typically wider on one side due to the nature of the laser drilling process, that side being chosen to be the rear or reverse side to facilitate flowing conductive material into the holes.

The substrate 12 used in the EL laminate should be one which can withstand the temperatures encountered in the subsequent processing steps. Typically substrates used are those which provide sufficient rigidity to support the laminate and which are stable to temperatures of 850° C. or greater to withstand the subsequent firing sintering steps for the thick film pastes and sol gel materials. The substrate should also be opaque to laser light, to allow the through holes 32 to be formed by laser drilling. Finally, the substrate should provide for good adherence of the thick film pastes used in subsequent steps. Crystalline ceramic materials and opaque vitreous materials may be used. Alumina is particularly preferred.

Figure 5:
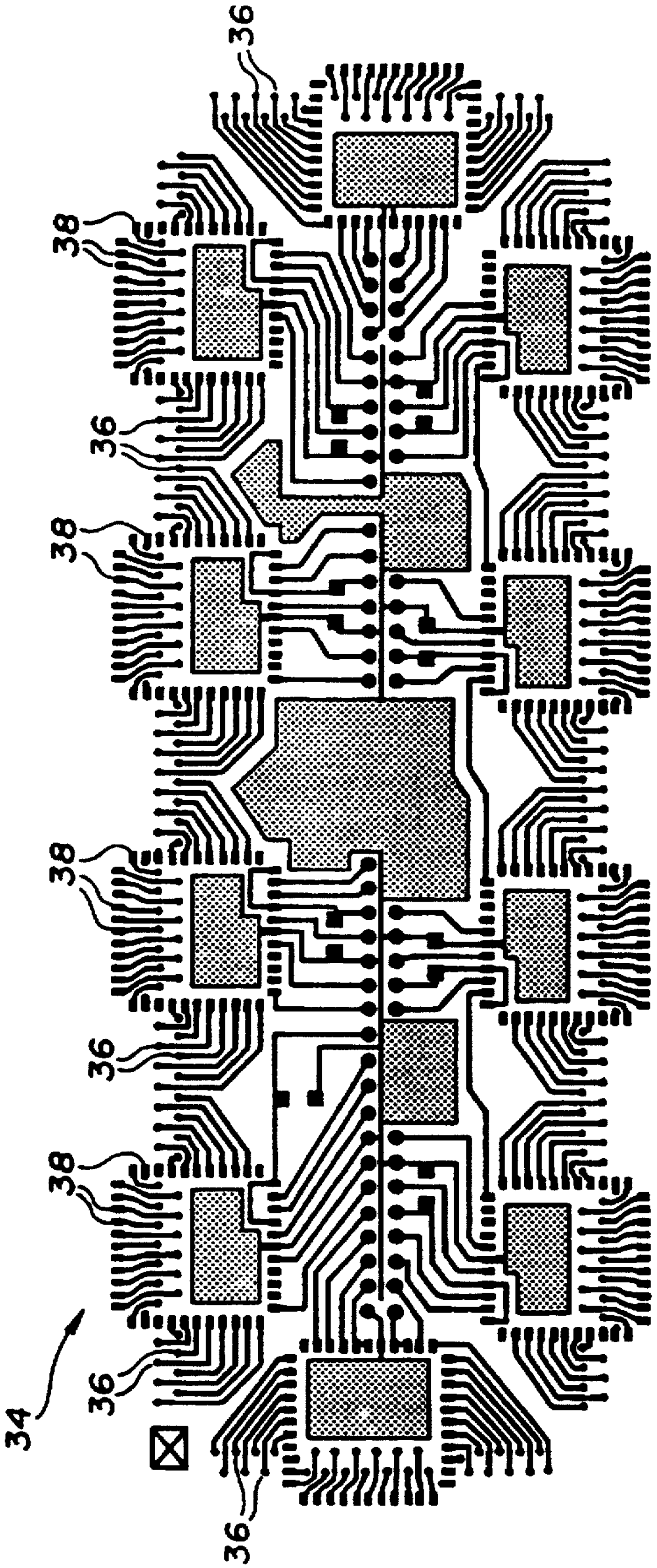
FIG. 5 is a top view of a preferred driver circuit pattern printed on the rear side of the rear substrate.

A circuit pattern 34 of conductive material is printed on the rear side of the substrate 12 in the pattern shown in FIG. 5. In this step, the conductive material is pulled through the through holes 32 in a manner to be discussed. The circuit pattern 34 on the rear side of the substrate 12 consists of rear connector pads 36 around each of the through holes 32, chip connector pads 38 for the outputs of the high voltage driver chips (not shown), further connector pads (not labelled) for connection to the rest of the drive circuit (not shown), and electrical leads (not labelled) between numerous of the connector pads as shown.

The conductive material is preferably a conductive thick film paste applied by screen printing. Silver/platinum thick film pastes are preferred.

To form a conductive path through each through hole 32, a vacuum is applied on the front side of the substrate 12 while the circuit 34 is printed on the rear side. This is preferably accomplished by placing the substrate 12 on a vacuum table with a master plate having holes drilled in the pattern of FIG. 4 between the substrate 12 and the vacuum. The holes in the master plate are aligned with and somewhat larger than the holes in the substrate 12. The vacuum is not applied until the circuit is printed to ensure that the vacuum is uniformly applied. The vacuum is continued until conductive material is pulled through to the front side of the substrate. At that point, a small amount of the conductive material is pulled through to the front side of the substrate 12 and the through hole walls are coated. The thick film paste is then fired in accordance with known procedures.

Figure 7:
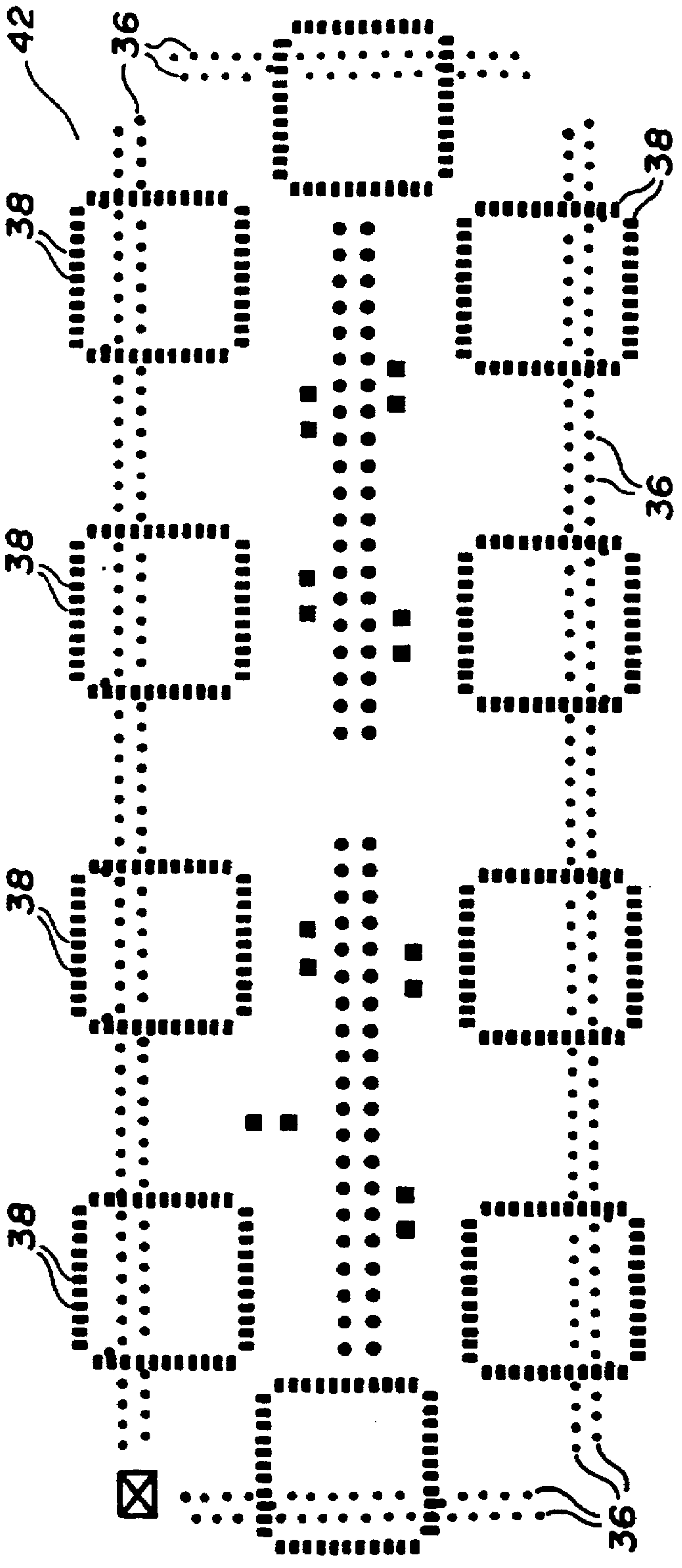
FIG. 7 is a top view of the circuit pad reinforcement pattern preferably printed over the driver circuit pattern of FIG. 5.

Following this step a circuit pad reinforcement pattern 42 is preferably, but not necessarily, printed as shown in FIG. 7. Similar conductive materials, printing and firing steps are followed.

Figure 6:
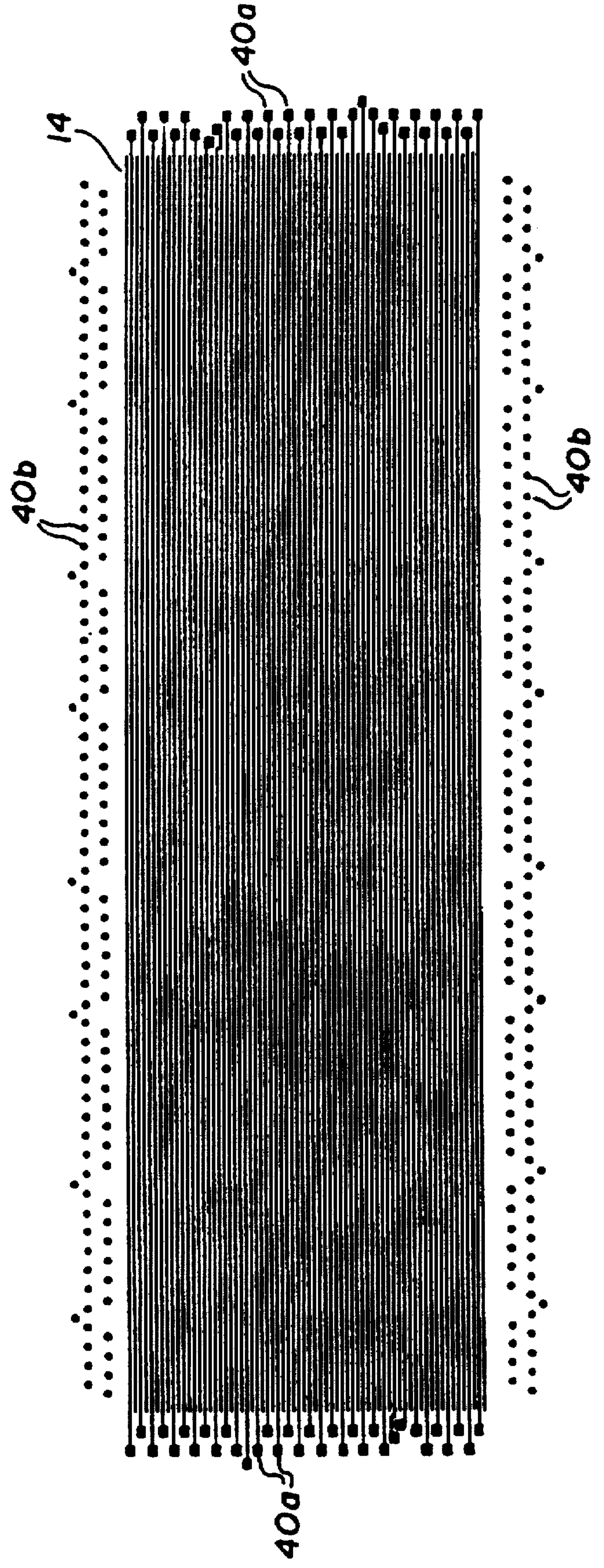
FIG. 6 is a top view of the row electrodes and column pads printed on the front side of the rear substrate.

The row address lines 14 and connector pads 40*a* and 40*b* are then formed on the front side of the substrate 12, preferably by screen printing a thick film conductive paste such as a silver/platinum paste. The address line pattern is shown in FIG. 6 to include rows extending along the length of the substrate 12 and ending at the front (row) connector pads 40*a*. During this same step, the front (column) connector pads 40*b* are printed to provide for ultimate connection of the column address lines to the driving circuitry via the through holes 32. The conductive paste is preferably pulled through the through holes 32 as above, with the vacuum being applied from the rear, circuit side of the substrate.

While the means forming a conductive path through the through holes 32 has been set out above to be formed from thick film conductive pastes, the conductive paths might also be formed as electroplated through holes, or as through holes formed by electroless plating, as is known in the art, provided the electroplated material adheres properly to the substrate and that subsequent layers adhere to the plated conductor.

The thick film dielectric layer 18 of this invention is then preferably formed and fired in the manner set out above.

Figure 8:
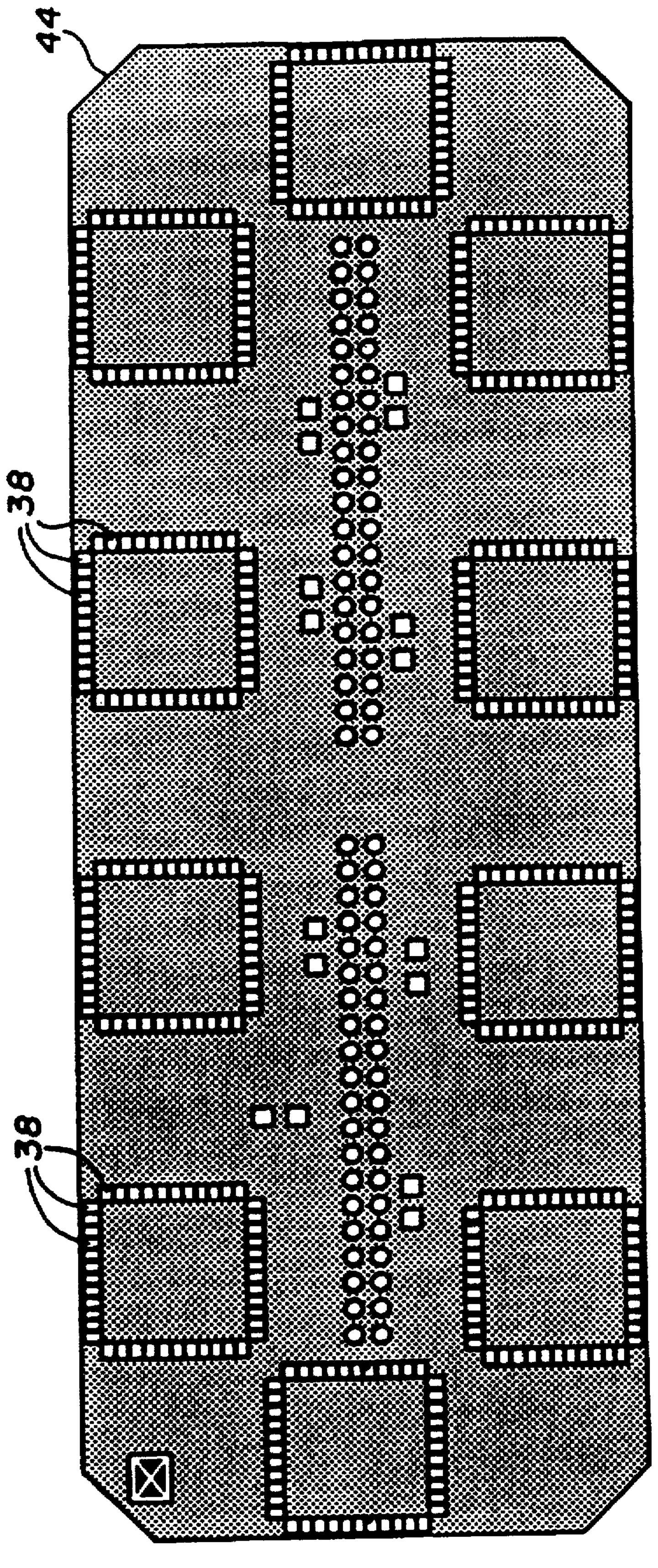
FIG. 8 is a top view of the sealing glass pattern preferably printed over the driver circuit pattern and circuit pad reinforcement pattern of FIGS. 5 and 7.

The rear circuit side of the substrate is then preferably sealed, with a rear sealant 44, for instance by screen printing with a thick film glass paste, leaving the connector pads exposed for attachment of the high voltage driver chips and connector pins 45 to the rest of the driver circuitry (not shown). The sealing pattern is shown in FIG. 8.

Figure 9:
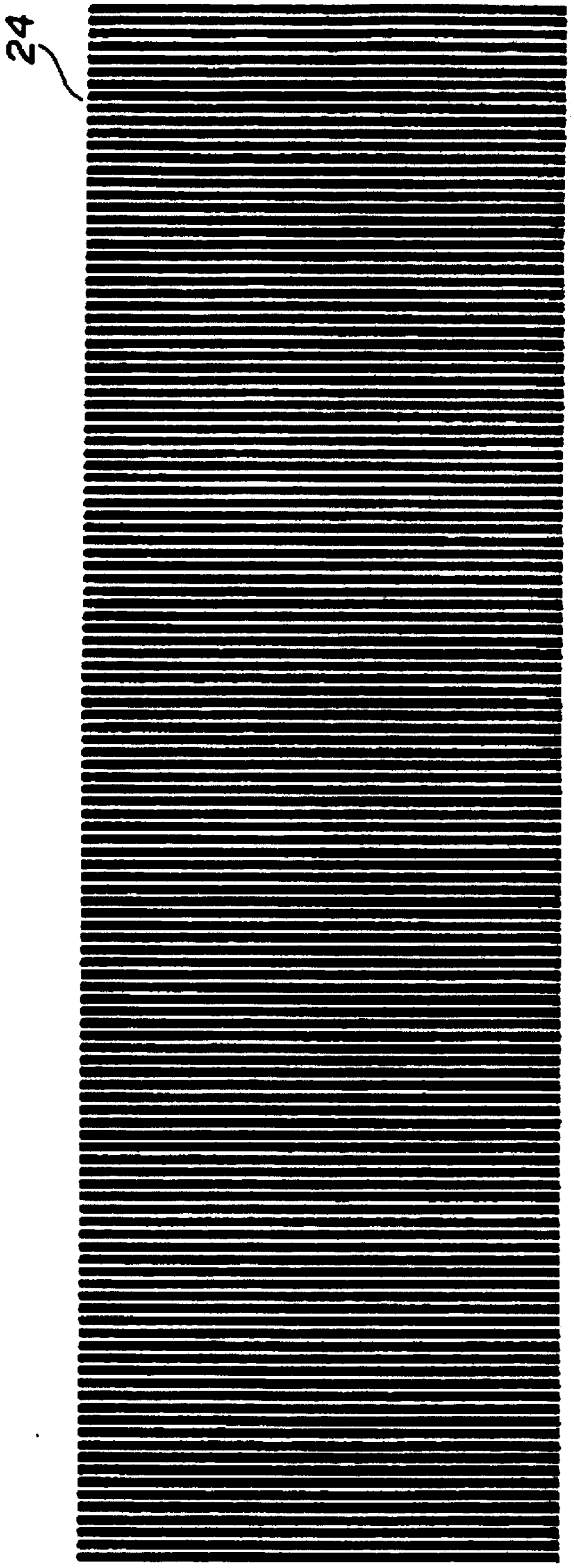
FIG. 9 is a top view of the column electrode line pattern.

The EL laminate is then completed with the sol gel layer 20, the phosphor layer 22 and the front column address lines 24, as described above. The pattern for the front column address lines 24 is shown in FIG. 9 to consist of parallel columns across the width of the substrate 12 ending proximate the front (column) connector pads 40.

Electrical interconnects 46 between the column address lines 24 and the front (column) connector pads 40 are provided, if necessary, for reliable electrical connection. These are preferably formed by printing a conductive material such as silver through a shadow mask in the pattern shown in FIG. 10.

A front sealing layer 26 as previously described is provided to prevent moisture penetration.

In accordance with the present invention, the front ITO address lines 24 of the EL laminate 10 are preferably formed by laser scribing. This laser scribing technique is set forth herein below in connection with the preferred EL laminate 10 of this invention. However, it should be understood that the laser scribing technique has broader application in patterning a planar laminate having overlying and underlying layers. In that respect, the ITO and phosphor layers 24, 22 are illustrative of overlying layers which do not absorb the laser light to any substantial extent, and the thick film lead niobate dielectric layer 18 and the sol gel layer 20 of lead zirconate titanate are illustrative of underlying layers that do absorb the laser light. Other typical materials used as transparent conductors include $SnO_2$ and $In_2O_3$.

Generally, in the broad context of the invention, the overlying layer is a material which is transparent to visible light and the underlying layer is a material which is opaque to visible light. The underlying material can then be directly ablated, and the overlying material indirectly ablated, by utilizing a laser beam with a wavelength in the visible or infrared region of the electromagnetic spectrum. This laser ablation method has broad application in patterning transparent conductive layers in semiconductors, liquid crystal displays, solar cells, and EL displays.

In order to control the precision and resolution of the laser scribing (depth and width of cuts), to avoid explosive delamination of the layers and to minimize interdiffusion between the layers, certain properties of the materials and thicknesses of the layers should be observed.

In respect of a two layer laminate, the following relationship should hold:

$$\alpha_u T_u > \alpha_o T_o,$$

wherein:

$\alpha_u$=absorption coefficient of underlying layer;
$\alpha_o$=absorption coefficient of overlying layer;
$T_u$=thickness of underlying layer; and
$T_o$=thickness of overlying layer.

More preferably, the product of $\alpha_u$ $T_u$ is very much greater than the product of $\alpha_o$ $T_o$.

When there is a plurality of overlying transparent layers and/or a plurality of underlying opaque layers, the sum of the product of $\alpha_u T_u$ for each layer should be greater than the sum of the product of $\alpha_o T_o$ for each layer, i.e.

$$\Sigma_i \alpha_{u_i} T_{u_i} > \Sigma_i \alpha_{o_i} T_{o_i}$$

If the above relationship is maintained, it should be possible to directly ablate only a portion of the underlying layer, without cutting through its entire thickness, and indirectly ablate through the entire thickness of the overlying layer, in accordance with the process of the invention.

Explosive delamination can result if heat or vapour pressure builds up in the underlying layer before the overlying layer can soften and/or vaporize by indirect ablation. Thus, the material in the overlying layer should melt and vaporize at a lower temperature than does the material in the underlying layer.

To enhance the ability to make high resolution cuts, the thermal conductivity of the material in the underlying layer is preferably less than that of the material in the overlying layer. The thermal conductivities of both layers should be such that significant heat does not flow away from the region being ablated in the time during which that region is exposed to the laser beam.

To avoid mass interdiffusion between layers, the diffusion time for such processes should be greater than the time during which the region to be ablated is exposed to the laser beam.

The above preferred properties are generally known for materials, making it possible to predict which materials are amenable to the laser scribing process of this invention.

Resolution of the laser cuts, explosive delamination and interdiffusion are also affected by the wavelength, power and scanning speed of the laser beam. However if the above relationships and properties are generally maintained, these other laser conditions can be controlled and varied to achieve the desired results of direct and indirect ablation.

Lasers are known which provide a laser beam with a wavelength in the visible or infrared region. Carbon dioxide lasers, argon lasers and YAG lasers are exemplary. All have wavelengths greater than about 400 nm. Pulsed or continuous wave (CW) lasers may be used, the latter being preferred to provide sharp, high resolution cuts. The laser beam is focused by appropriate known lens systems to achieve the desired resolution and to ensure sufficient local power density for complete removal of overlying layer. Generally, the power density of the laser beam is set so that the groove which is cut is significantly greater than the thickness of the overlying transparent layers. When the transparent layer comprises electrode address lines, this ensures that the address lines are clearly defined and electrically isolated.

Scribing can be performed either by moving the laser beam with respect to the material being scribed or more preferably, by mounting the material to be scribed on an X-Y coordinates table that is moveable relative to the laser beam. For scribing address lines, a table moveable in the X direction (i.e. perpendicular to the lines being scribed) is preferred, the laser beam being moveable in the Y direction, i.e. along the lines.

Material which is vaporized or decomposed during the laser scribing process may be drawn away from the material being scribed by a vacuum located proximate to the laser beam.

In the preferred EL laminate 10 of the present invention, a thin layer of indium tin oxide 24 is deposited by known methods above the phosphor layer 22. Vacuum deposition methods or sol gel methods to deposit ITO are disclosed in U.S. Pat. Nos. 4,568,578 and 4,849,252. Materials other than ITO may be used, for example fluorine doped tin oxide. An optional transparent dielectric layer can be provided between the ITO and phosphor layers 24, 22. The preferred sol gel layer 20 of PZT and the thick film dielectric layer 18 of lead niobate underlie the phosphor layer. The EL laminate 10 is formed in reverse sequence to conventional TFEL devices, as described hereinabove. This conveniently leaves the ITO layer 24 and the phosphor layer 22 as upper (overlying) transparent layers above lower (underlying) opaque dielectric layers 18, 20 (lead niobate and PZT), amenable to laser scribing in accordance with the present invention.

The individual column address lines 24 are laser scribed, as described above. The laser beam directly ablates at least a portion of the sol gel layer 20 and possible a minor portion of the thick underlying dielectric layer 18 and indirectly ablates the ITO and phosphor layers 24, 22 throughout their thicknesses. This leaves a reliable insulating gap between the adjacent address lines.

The column address lines 24 are connected to the driving circuitry as described above. More particularly, in accordance with the preferred through hole connecting process described above, the electrical interconnects 46 are formed (prior to laser scribing) by evaporating silver in the pattern shown in FIG. 10 in locations to overlap the portions of the ITO layer which will ultimately form the address lines. The address lines are then scribed in the manner set out above.

The completed EL laminate 10 can be sealed as described above by spraying a protective polymer sealant on the front viewing surface or by bonding a glass plate 26 to the front surface.

Several advantages are derived by using indirect ablation to scribe transparent conductor materials. A relatively low power continuous wave laser producing light in the visible range can be used rather than an ultraviolet pulsed laser with a high instantaneous power output. This not only reduces laser costs, but produces smoother edges on the ablated cuts. This is particularly important for high resolution EL displays. Direct ablation of transparent materials requires very high instantaneous laser power to deposit the energy necessary for the ablation in a time short enough to prevent diffusion of heat away from the area where ablation is to occur. In prior art attempts to directly ablate a transparent conductor deposited on a transparent substrate, only a small fraction of the laser power is directly absorbed by the transparent conductor material; most of the light passes through both transparent layers. In many cases, indirect ablation can minimize the problem of interdiffusion between layers, since the heating to vaporize the transparent layers occurs from the bottom of the transparent layers. This promotes the removal of ablated material outwardly and upwardly in the stream of vaporized material, rather than diffusion of the material into the underlying layer. This is particularly important in order to preserve the quality of the dielectric and phosphor layers in EL displays.

The present invention is further illustrated by the following non-limiting examples.

EXAMPLE 1

This example is included to illustrate that simply screen printing a thick film layer of barium titanate (the material used as a ceramic sheet in the Miyata et al. references) is subject to electric breakdown under operating conditions of about 200 V.

A single pixel electroluminescent device was constructed on an alumina substrate (5 cm square, 0.1 cm thick) obtained from Coors Ceramics (Grand Junction, Color. U.S.A.). A rear electrode layer was applied, centered on the substrate, but spaced from the edges. The material used was a silver/platinum conductor which was printed as address lines as is conventional in electronics. More particularly, Cermalloy #C4740 (available from Cermalloy, Conshohocken, Pa.) was screen printed as a thick film paste through a 320 mesh stainless steel screen and coated with an emulsion. The emulsion was exposed to ultraviolet light through a photomask, so as to expose those areas of the emulsion that were to be retained for printing. The unexposed emulsion was dissolved away with water where paste was to be printed through the screen. The remaining emulsion was then further hardened with additional light exposure. The printed paste was dried in an oven at 150° C. for a few minutes and fired in air in a BTU model TFF 142-790A24 belt furnace with a temperature profile as recommended by the paste manufacturer. The maximum processing temperature was 850° C. The resulting thickness of the fired electrode conductor layer was about 9 microns.

A dielectric layer was formed on this electrode layer as follows. A dielectric paste comprising barium titanate (ESL #4520—available from Electroscience Laboratories, King of Prussia, Pa., dielectric constant 2500–3000) was printed through a 200 mesh screen in a square pattern so that all but an electrical contact pad at the edge of the electrode was covered. The printed dielectric paste was fired in air in the BTU furnace with a temperature profile as recommended by the manufacturer (maximum temperature 900°–1000° C.). The thickness of the resulting fired dielectric was in the range of 12 to 15 microns. A second and third layer of the dielectric were then printed and fired over the first layer in the same manner. The combined thickness of the three printed and sintered dielectric layers was 40 to 50 microns.

A phosphor layer was deposited directly onto the dielectric layer in accordance with known thin film techniques. In particular, a 0.5 micron thick layer of zinc sulphide doped with 1 mole percent of manganese was evaporated onto the dielectric layer using a UHV Instruments Model 6000 electron beam evaporator. The layers were heated under vacuum in the evaporator and were held at a temperature of 150° C. during the evaporation process which took approximately 2 minutes.

The phosphor layer was coated with a 0.5 micron layer of a transparent electrical conductor consisting of indium tin oxide. This layer was applied by known thin film deposition techniques, in particular using the electron beam evaporator at 400° C. under vacuum.

The laminate was subsequently annealed in air for 15 minutes at 450° C. to anneal the phosphor and indium tin oxide conductor layers. An indium solder contact was provided to the ITO layer. The device was sealed with a silicone sealant (Silicone Resin Clear Lacquer, cat.#419, from M. G. Chemicals).

The device was tested by applying a DC voltage of 200 volts across the two electrodes. The device was observed to fail upon application of the voltage due to electrical breakdown of the dielectric layer in the region immediately surrounding the contact to the indium tin oxide.

Without being bound by same, it is believed that the failure of the device was because the dielectric layer did not provide the needed smooth surface for the phosphor layer. Microcracks could be observed at the surface. This may, however, be due to the presence of deleterious materials in the commercial dielectric paste and is thus not an indication that barium titanate cannot be used as a single or first dielectric layer in accordance with the present invention.

EXAMPLE 2

This example is included to illustrate that a screen printed dielectric layer from a paste containing lead niobate, a material known to have a high dielectric constant and a lower sintering temperature than barium titanate, provides adequate dielectric strength, but does not luminesce.

A device was constructed that was similar to that in Example 1, but having a dielectric layer formed from a dielectric paste of lead niobate, Cermalloy #IP9333 (dielectric constant about 3500, thickness as in Example 1). The device, when tested was not subject to dielectric breakdown when a DC voltage of 400 volts was applied. However, it failed to luminesce on application of an AC voltage.

Without being bound by the same it is believed that the failure to luminesce was due to compatibility problems at the interface with the phosphor layer. Thus this example should not be taken as an indication that lead niobate cannot be used as single or first dielectric layer in accordance with the present invention.

EXAMPLE 3

This example illustrates a two layer dielectric constructed in accordance with the present invention, with a first dielectric layer of lead niobate (as in Example 2) and a second dielectric layer of lead zirconate titanate. Favourable luminescence was achieved.

A device identical to that in Example 2 was constructed, but with the additional step of applying a layer of lead zirconate titanate (PZT) using a sol gel process to the printed and fired dielectric layer before the phosphor layer was applied. The sol was prepared in the following manner. Acetic acid was dehydrated at 105° C. for 5 minutes. Twelve grams of lead acetate was dissolved into 7 ml. of the dehydrated acid at 80° C. to form a colourless solution. The solution was allowed to cool, and 5.54 g of zirconium propoxide was stirred into the solution to form a pale yellow solution. The solution was held at 60° C. to 80° C. for five minutes after which 2.18 g of titanium isopropoxide was added with stirring. The resulting solution was agitated for approximately 20 minutes in an ultrasonic bath to ensure that any remaining solids were dissolved. Then, approximately 1.75 ml of a 4:2:1 ethylene glycol to propanol to water solution was added to make a stable sol. More ethylene glycol was added before coating to adjust the viscosity to the desired value for spin coating or dipping. The prepared dielectric layer was spin coated in one case and dipped in another case with the sol. In the case of spin coating the sol was dribbled onto the first dielectric layer which was spinning in a horizontal plane at 3000 rpm. In the case of dipping, a higher viscosity sol was used. For the dipping procedure the substrate was pulled from the sol at a rate of 5 cm per minute. The resulting coated assembly was then heated in air in an oven at a temperature of 600° C. for 30 minutes to convert the sol to PZT. The thickness of the PZT layer was approximately 2 to 3 microns. The surface of the PZT layer was observed to be considerably smoother than that of the screen printed and sintered first dielectric layer.

Following application of the PZT layer, the phosphor and transparent conductor layers were deposited as in Example 1.

The completed laminate performed well with luminosity versus voltage characteristics similar to or better than those reported by Miyata et al. The threshold voltage for minimum luminance for the display was 110 V. Luminosity at 50 volts above threshold (i.e. 160 volts, 60 Hz) was 57 foot Lamberts.

EXAMPLE 4

This example is included to illustrate that variations in the thickness of the dielectric layer have an effect on both the operating voltage and the luminance of the displays.

A display was constructed as in Example 3, except that only two instead of three screen printed layers of dielectric were applied. The thickness of the first dielectric layer was correspondingly reduced to 25 to 30 microns.

The display functioned well. The threshold voltage for minimum luminance was 70 volts (cp 110 volts in Example 3), expected from theoretical considerations. The luminosity at 50 volts above the threshold value also decreased to 35 foot Lamberts (cp 57 foot Lamberts in Example 3).

EXAMPLE 5

This example illustrates the preferred embodiment of connecting the row and column address lines of the EL laminate to the driver circuit using through holes.

An addressable EL display was constructed using the same sequence of layer depositions as set forth in Example 3. The substrate was a 0.025 inch thick rectangle of alumina obtained from Coors Ceramics (Grand Junction, Color., U.S.A.) having dimensions of length—6 inches and width—2 inches. The substrate was drilled with 0.006 inch diameter through holes using a carbon dioxide laser in the pattern shown in FIG. 4. The substrate was inspected to ensure that all of the holes were clear. The holes were found to be about 0.008 inches in diameter on the side facing the laser and about 0.006 inches on the opposite side. The side with the wider hole openings was chosen to be the rear side of the substrate to facilitate flowing conductive material into the through holes.

Following this, the circuit pattern shown in FIG. 5 was printed onto the rear side of the substrate through a 325 mesh stainless steel screen using Cermalloy #4740 silver platinum paste. During the printing process, the substrate was aligned with a master plate having 0.040 inch holes drilled in the same pattern as shown in FIG. 4 and a vacuum was applied below the master plate to pull the conductive paste through the through holes in the substrate (i.e. through to the front, viewing side of the substrate). This step formed the circuit pattern of FIG. 5 together with a conductive path through each of the through holes in the substrate. To ensure uniformity in the application of the vacuum, the vacuum was not turned on until the substrate had been printed. The part was inspected to ensure that the through holes were filled.

Following printing, the substrate was fired in air in a BTU model TFF 142-790A24 belt furnace with a temperature profile recommended by the paste manufacturer. The maximum temperature was 850° C.

Following this step, a circuit reinforcement pattern as shown in FIG. 7 was printed and fired on the rear, circuit side of the substrate (using the same Cermalloy conductive paste). This step made the circuit pattern thicker in certain areas where electrical connections were to be subsequently made.

The row address lines and the front row and column connector pads were then screen printed on the front viewing side of the substrate. The lines extended across the length of the substrate to the row connector pads in the pattern shown in FIG. 6. The column connector pads, as shown in FIG. 6, were printed in this same step. The row address lines and connector pads were formed from the same conductive paste (Cermalloy #4740) using the same printing and firing conditions. The substrate was positioned on the same master plate with the through hole pattern of FIG. 4 and a vacuum was applied from below to pull the conductive paste through the through holes toward the rear side of the substrate. The thickness of the fired electrode layer was about 8 micrometers. There were about 52 address lines per inch and the total number of address lines was 68. The part was examined to ensure the through holes were filled.

The three layers of the dielectric paste (Cermalloy #IP9333 were printed and fired as set forth in Example 3 to form a dielectric layer of about 50 micrometers thickness.

The rear, circuit side of the substrate was then sealed. A thick film glass paste (Heraeus IP9028, from Heraeus-Cermalloy, Conshohocken, Pa.) was screen printed using a 250 mesh screen in the pattern shown in FIG. 8. The connector pads for connection to the high voltage driver chips and other driver circuitry were left uncovered. The glass sealing layer was then fired in the BTU belt furnace using a temperature profile recommended by the manufacturer with a maximum temperature of 700° C.

During the above mentioned firing steps, the substrate was supported on pieces of ceramic material at either end to avoid contact between the printed material on the circuit side and the belt of the furnace.

The sol gel layers were then formed by dipping substantially as set out in Example 3. Three or four sol gel layers were typically used, with pulling rates of 10–25 sec/in from a mixture having a viscosity of about 100 cp as measured by the falling ball viscometer. Between dipping layers, the sol gel was dried at 110° C. for 10 min. A vacuum chuck was placed over the active area of the laminate and the sol gel was water washed off the remaining areas. The layer was then fired at about 600° C. in a belt furnace for 25 min. A total sol gel thickness between 3–10 micrometres was achieved. This was followed by the phosphor layer of Example 3 using zinc sulfide doped with 1% manganese with a thickness of 0.5–1.0 micrometers.

The column address lines were then deposited from indium tin oxide, as described in Example 3, in the pattern shown in FIG. 9. There were about 52 column address lines per inch and a total of 256 columns. The spacing between the lines was 0.001 inches and the line width was 0.019 inches (center to center).

Figure 10:
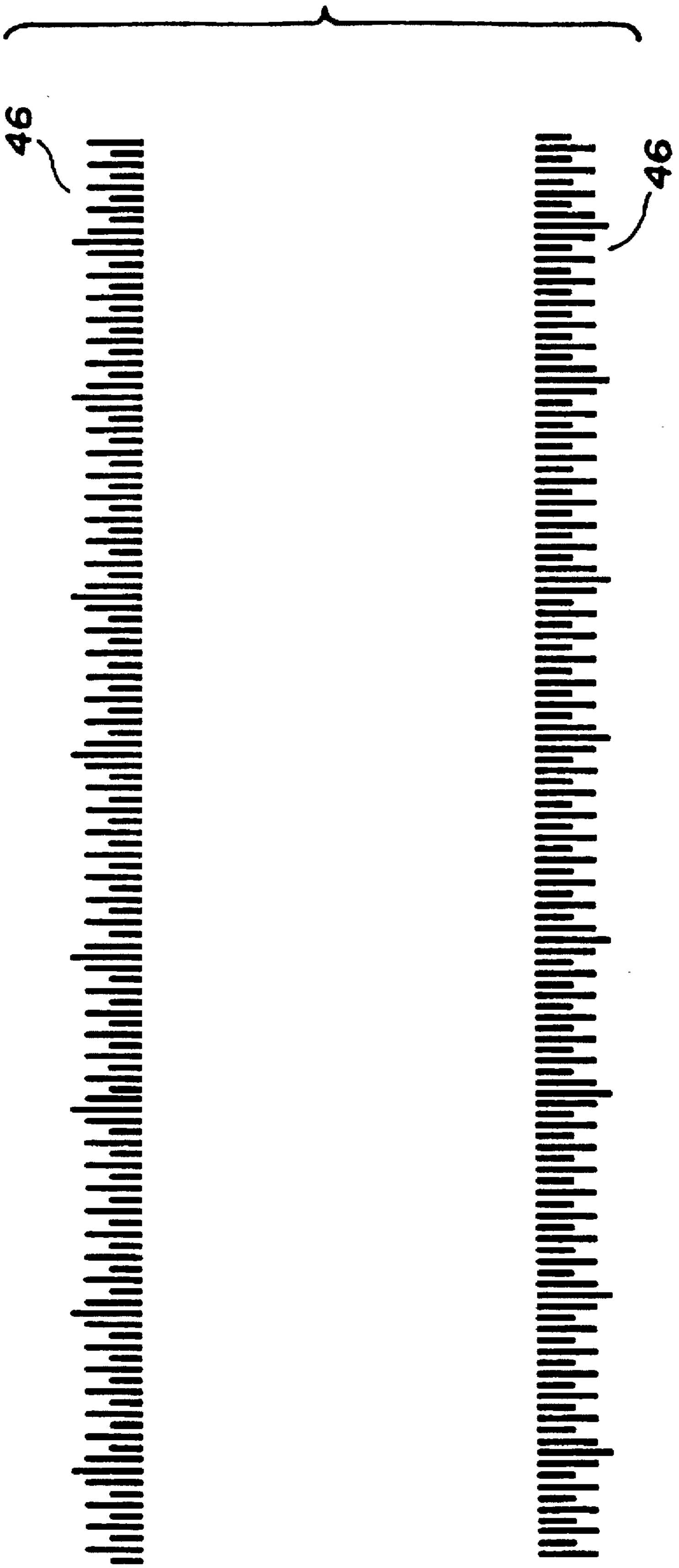
FIG. 10 is a top view of the electrical connections printed between the column lines of FIG. 9 and the column pads of FIG. 6.

Silver was evaporated through a shadow mask in the pattern shown in FIG. 10 to make the electrical connections of the column address lines to the column connector pads and through hole conductors on the substrate.

The viewing surface of the laminate was sealed with a silicone sealant sprayed over the entire front face of the display. The sealant used was Silicone Resin Clear Lacquer, Cat. #419 from M. G. Chemicals (location?).

The completed display was tested by connecting a pulse generator providing a 160 V square wave signal at 60 Hz across pairs of row and column pads on the circuit deposited on the rear of the substrate. Each pixel of the display was found to light up independently and with a consistent intensity equal to that measured in Example 3 when the voltage was applied. No dysfunctional pixels were found among the total pixel count of 17408.

EXAMPLE 6

This example illustrates the preferred embodiment of laser scribing the indium tin oxide address lines of the EL laminate of the present invention.

An addressable matrix display was constructed on a ceramic substrate using the following procedure. The substrate was a 0.025 inch thick rectangle of alumina with length 6 inches and width 2 inches obtained from Coors Ceramics (Grand Junction, Colo., U.S.A.). This was drilled with 0.006 inch diameter holes with a carbon dioxide laser in the pattern shown in FIG. 4. The part was inspected to ensure that all of the holes were clear.

Following this step, the circuit pattern shown in FIG. 5 was printed through a 325 mesh stainless steel screen using Cermalloy (Conshohocken Pa., U.S.A.) #4740 silver platinum paste. During the printing process, the substrate was aligned with a master plate having 0.040 inch holes drilled in the same pattern as the substrate to facilitate applying a vacuum to the substrate holes during printing. The vacuum sucked paste through the holes to facilitate the formation of a conductive path through the ceramic substrate after the part was fired. The part was fired in air in a BTU model TFF 142-790A24 belt furnace with a temperature profile recommended by the paste manufacturer, having a maximum temperature of 850° C.

Following this step, a circuit reinforcement pattern as shown in FIG. 7 was printed and fired on the rear, circuit side of the substrate (using the same Cermalloy conductive paste). This step made the circuit pattern thicker in certain areas where electrical connections were to be subsequently made.

Following this, a set of row address lines and connector pads were printed on the front viewing side of the substrate. The lines extended along the length of the substrate to the row connector pads (as shown in FIG. 6). The column connector pads were also formed in this step (as shown in FIG. 6). The row address lines and the row and column connector pads were formed from the same silver platinum paste using the same printing and firing conditions. The substrate was positioned on the same master plate with the through hole pattern of FIG. 4 and a vacuum was applied from below to pull the conductive paste through the through holes toward the rear side of the substrate. The thickness of the fired electrode layer was about 8 micrometers. There were 52 address lines per inch and the total number of address lines was 68.

Next three layers of lead niobate dielectric paste (Cermalloy #IP9333) were sequentially printed and fired in the belt furnace with a temperature profile as recommended by the manufacturer (maximum temperature 850 C.) on top of the row address lines (as set forth in Example 3). The combined thickness of the dielectric layers was 50 micrometers.

Following this, the rear, circuit side of the substrate was sealed as set forth in Example 5, in the pattern shown in FIG. 8.

Next, a 3–10 micrometer thick layer of lead zirconate titanate (PZT) was deposited on the lead niobate layer to form a smooth surface. The sol gel technique using dipping, as set out in Example 5, was used. A thin film phosphor layer was then deposited using electron beam evaporation methods as known in the art. The phosphor layer was zinc sulfide doped with 1% manganese, which was deposited to a thickness of between 0.5 and 1 micrometers.

The next step was to deposit a 300 nanometre thick layer of indium tin oxide (ITO) on the phosphor layers using electron beam evaporation methods as known in the art.

This ITO layer was then patterned into 256 address lines using a 2 Watt CW (continuous wave) argon ion laser tuned to a wavelength of 514.5 nanometres. The EL laminate was mounted on a moveable X coordinate table, which moved the laminate in a direction perpendicular to the lines being scribed beneath the laser beam. The laser beam was moved in the Y direction to scribe the lines. The laser beam was focussed to a 12 micrometer spot and the laser power was adjusted so that the indium tin oxide, the underlying phosphor layer and about 10% of the combined underlying dielectric layers were ablated away where the laser beam had scanned (about 1.8 W). The scanning speed was controlled at about 100 and 500 mm/sec to provide address lines with about 40 or 25 micrometres gap respectively and address line depth of 6–8 or 3–4 micrometres respectively. The spacing between address lines (i.e. between centres of the lines) was about 500 micrometers. A vacuum adjacent the substrate withdrew vaporized and ablated material. The pattern of the transparent electrodes, once the ablation was completed, was as shown in FIG. 9. On the completed display, there were about 50 column address lines per inch and a total of 256 columns.

Prior to scribing the ITO column address lines, the silver interconnects between the front (column) connector pads and the ultimate ITO address lines were screen printed from silver through a shadow mask in the pattern of FIG. 10.

After laser scribing, the front viewing side of the completed display was sprayed with a protective polymer coating (Silicone Resin Clear Lacquer, cat #419 from MG Chemicals).

The display was then tested by applying a voltage across selected pixels by connecting a pulsed power supply providing voltage pulses of 160 volts at a repetition rate of 64 Hz. The pixels each lit up reliably with a luminosity similar to that of the single pixel device of the previous example.

The resolution of the address lines of this example is generally much higher than is achievable with state of the art photolithographic techniques. Commercially available devices typically have ITO address lines with widths of 180–205 micrometers and gaps between the lines of 65–80 micrometers. As set out above, in accordance with this invention, gaps of 25 and 40 micrometers were produced, depending on the laser scanning speed. This higher resolution allows for a higher ratio of active to total area of the display, since wider ITO address lines with smaller gaps can be used.

EXAMPLE 7

This example illustrates a two layer dielectric constructed in accordance with the present invention but with the first dielectric layer being constructed from a paste having a higher dielectric constant than the paste used in Examples 3 and 4.

The device was constructed as set forth in Example 3, but having a first dielectric layer formed from a lead niobate aste available from Electroscience Laboratories as a high K capacitor paste under the number 4210. The sintered paste has a dielectric constant of about 10,000. The first dielectric layer had a thickness of about 50 microns. A sol gel layer of PZT was applied, as described in Example 3, to a thickness of about 5 microns.

The device functioned well with a threshold voltage for minimum luminance of 91 Volts and a luminosity at 150 Volts of 50 foot Lamberts.

EXAMPLE 8

This example illustrates a two layer dielectric constructed with a first dielectric layer formed from a lead niobate paste and a second dielectric layer formed from lead lanthanum zirconate titanate (PLZT). PLZT has a dielectric constant of about 1,000. The PLZT had a molar ratio of zirconium to titanium to lanthanum of 52:32:16.

The device was constructed as set forth in Example 3, with the sol gel layer being prepared as follows:

Into 50 ml of glacial acetic acid was dissolved 120 grams of 99.5% purity lead acetate. The resulting solution was heated to 90° C. and held at this temperature for 2 minutes before being cooled to 70° C. Next, 55.4 grams of zirconium propoxide was added and the resulting solution was heated to 80° C. and held at that temperature for 1 minute. After cooling to 70° C., 21.8 grams of titanium isopropoxide was added. Next, 11.4 grams of lanthanum nitrate was dissolved in 20 ml of glacial acetic acid, and this was added to the solution. Finally, to stabilize the solution and adjust the viscosity to a suitable value, 10 ml of ethylene glycol, 5 ml of propan-2-ol and 2.5 ml of demineralized water were added.

The PLZT sol gel was applied to the first dielectric layer by dipping in a manner similar to that described in Example 3. The dipped parts were fired at 600° C. to convert the second layer to PLZT. Four coats of PLZT were applied by successive dipping and firing in this way to prepare a surface of adequate smoothness for the deposition of the phosphor layer. A total thickness of 5 microns was achieved.

The device functioned well with a threshold voltage of 75 Volts and a luminosity of 37 foot Lamberts at 150 Volts.

All publications mentioned in this specification are indicative of the level of skill of those skilled in the art to which this invention pertains. All publications are herein incorporated by reference to the same extent as if each individual publication was specifically and individually indicated to be incorporated by reference.

The terms and expressions used in this specification are used as terms of description and not of limitation. There is no intention, in using Such terms and expressions, of excluding equivalents of the features shown and described, it being recognized that the scope of the invention is defined and limited only by the claims which follow.

We claim:

1. A process for laser scribing a pattern in a planar laminate having at least one overlying layer and at least one underlying layer, comprising:

applying a focused laser beam to an area of the pattern to be ablated on the overlying layer side of the laminate, said laser beam having a wavelength which is substantially unabsorbed by the overlaying layer but which is absorbed by the underlying layer, such that at least a portion of the underlying layer is directly ablated and the overlying layer is indirectly ablated throughout its thickness in the area of the pattern to be ablated.

2. The process of claim 1, wherein the overlying layer is transparent to visible light and the underlying layer is opaque to visible light and wherein the wavelength of the laser beam is in the visible or infrared region of the electromagnetic spectrum.

3. The process of claim 1 wherein the composition and thicknesses of the layers are such that:

$$\Sigma_i \alpha_{u_i} T_{u_i} > \Sigma_i \alpha_{o_i} T_{o_i}$$

wherein;

$\alpha_u$=absorption coefficient of underlying layer;

$\alpha_o$=absorption coefficient of overlying layer;

$T_u$=thickness of underlying layer; and $T_o$=thickness of overlying layer.

4. The process of claim 3, wherein the composition of the layers is such that the overlying layer vaporizes at a lower temperature than does the underlying layer.

5. The process of claim 4, wherein the composition of the layers is such that the overlying layer has a higher thermal conductivity than does the underlying layer.

6. The process of claim 1, wherein the overlying layer is a transparent conductive material into which an electrode pattern is scribed.

7. The process of claim 6, wherein the electrode pattern is formed by moving one or both of the laminate and the laser beam relative to the other.

8. The process of claim 7, wherein the laminate is an EL laminate having a phosphor layer sandwiched between a front and rear set of intersecting address lines, the rear address lines being formed on a rear substrate, and the phosphor layer being separated from the rear address lines by one or more dielectric layers, the overlying layer comprises the front address lines, formed from a transparent conductive material, and the phosphor layer, the underlying layer comprises the one or more dielectric layers, and the electrode pattern consists of a plurality of parallel spaced address lines of the transparent conductive material.

9. The process of claim 8, wherein a portion of the dielectric layer is directly ablated and the phosphor and transparent conductive material are indirectly ablated throughout their thicknesses.

10. The process of claim 9, wherein the transparent conductive material is indium tin oxide.

11. A process for laser scribing an electrode pattern in an EL laminate having a phosphor layer sandwiched between a front and rear set of intersecting address lines, the rear address lines being formed on a rear substrate, the phosphor layer being separated from the rear address lines by one or more dielectric layers, and the front address lines being formed from a transparent conductive material, the process comprising:

applying a focused laser beam to an area of pattern to be ablated in the transparent conductive material, said laser beam having a wavelength which is substantially unabsorbed by the transparent conductive material but which is absorbed by the one or more dielectric layers or the phosphor layer, such that the phosphor layer is directly ablated throughout its thickness, a portion of the one or more dielectric layers is directly ablated and the transparent conductive material is indirectly ablated throughout its thickness, the ablation being in the area of the pattern to be ablated;

forming the electrode pattern by moving one or both of the laminate and the laser beam relative to each to other in the electrode pattern; and wherein the dielectric layer comprises:

a planar layer formed from a sintered ceramic material such that the dielectric layer provides a dielectric strength greater than about $1.0\times10^6$ V/m and a dielectric constant such that the ratio of the dielectric constant of the dielectric material to that of the phosphor is greater than about 50:1, the dielectric layer having a thickness such that the ratio of the thickness of the dielectric layer to that of the phosphor layer is in the range of about 20:1 to 500:1, and the dielectric layer having a surface adjacent the phosphor layer which is sufficiently smooth that the phosphor layer illuminates generally uniformly at a given excitation voltage.

12. The process as set forth in claim 11, wherein the dielectric layer is formed from at least two layers, a first dielectric layer formed on the rear electrode and having a dielectric constant greater than about 500 and a thickness in the range of about 10 to 300 microns, and a second dielectric layer formed on the first dielectric layer and having the surface adjacent the phosphor layer as set forth in claim 11, the first and second dielectric layers having a combined thickness of about 10 to 300 microns.

13. The process as set forth in claim 12, wherein the first and second dielectric layers are formed from ferroelectric ceramic materials having perovskite crystal structures, wherein the first dielectric layer provides a dielectric constant of at least 1000 and has a thickness of about 20–150 microns, and wherein the second dielectric layer provides a dielectric constant of at least 100 and has a thickness of about 2–10 microns.

14. The process as set forth in claim 13, wherein the first dielectric layer is formed by screen printing and sintering a thick film dielectric paste and the second dielectric layer is formed by sol gel techniques followed by sintering.

15. The process as set forth in claim 14, wherein the first dielectric layer is formed from lead niobate and wherein the second dielectric layer is formed from lead zirconate titanate or lead lanthanum zirconate titanate.

16. The process of claim 11, wherein the transparent conductive material is indium tin oxide.

* * * * *

UNITED STATES PATENT AND TRADEMARK OFFICE

CERTIFICATE OF CORRECTION

PATENT NO. : 5,702,565
DATED : December 30, 1997
INVENTOR(S) : Wu et al.

It is certified that error appears in the above-identified patent and that said Letters Patent is hereby corrected as shown below:

Column 13,
Line 23, Equation (3), delete " $V = (K_1 * d_2 / k_2 + d_1) * E_1$ " and replace with
-- $V = (k_1 * d_2 / k_2 + d_1) * E_1$ --.

Signed and Sealed this

Ninth Day of April, 2002

*Attest:*

JAMES E. ROGAN
*Director of the United States Patent and Trademark Office*

*Attesting Officer*